United States Patent
Ishihara et al.

(10) Patent No.: US 10,524,343 B2
(45) Date of Patent: Dec. 31, 2019

(54) EXTREME ULTRAVIOLET LIGHT GENERATION APPARATUS

(71) Applicant: Gigaphoton Inc., Tochigi (JP)

(72) Inventors: Takanobu Ishihara, Oyama (JP); Toshihiro Nishisaka, Oyama (JP); Yutaka Shiraishi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/429,331

(22) Filed: Jun. 3, 2019

(65) Prior Publication Data
US 2019/0289705 A1 Sep. 19, 2019

Related U.S. Application Data

(63) Continuation of application No. PCT/JP2017/003211, filed on Jan. 30, 2017.

(51) Int. Cl.
*H05G 2/00* (2006.01)
*G03F 7/20* (2006.01)

(52) U.S. Cl.
CPC ......... *H05G 2/006* (2013.01); *G03F 7/70033* (2013.01); *H05G 2/005* (2013.01); *H05G 2/008* (2013.01)

(58) Field of Classification Search
CPC ........ H05G 2/001; H05G 2/005; H05G 2/006; H05G 2/008; G03F 7/70033;
(Continued)

(56) References Cited

U.S. PATENT DOCUMENTS

2003/0223546 A1 12/2003 McGregor et al.
2006/0043319 A1 3/2006 Gaebel et al.
(Continued)

FOREIGN PATENT DOCUMENTS

JP 2004-006365 A 1/2004
JP 2006-086119 A 3/2006
(Continued)

OTHER PUBLICATIONS

International Search Report issued in PCT/JP2017/003211; dated Apr. 11, 2017.
(Continued)

*Primary Examiner* — David E Smith
*Assistant Examiner* — Hsien C Tsai
(74) *Attorney, Agent, or Firm* — Studebaker & Brackett PC

(57) ABSTRACT

An extreme ultraviolet light generation apparatus includes: a chamber; a target supply unit that supplies a droplet of a target substance to a plasma generation region in the chamber; a first pipe at least partly covering a trajectory of the droplet and having a first opened end part as an upstream end part and a second opened end part as a downstream end part in a trajectory direction; a second pipe at least partly covering the first pipe with a gap between the second pipe and the first pipe, and having a third end part, opened and extending downstream of the second end part of the first pipe in the trajectory direction, as a downstream end part in the trajectory direction; and a gas supply unit that supplies gas flowing through the gap and causes the gas to flow in the trajectory direction out of a gas exit.

18 Claims, 14 Drawing Sheets

(58) Field of Classification Search
CPC .......... G03F 7/70175; G03F 7/70808; G03F 7/70841; G03F 7/70908; G03F 7/70916; G03F 7/70933
See application file for complete search history.

(56) References Cited

U.S. PATENT DOCUMENTS

| | | | |
|---|---|---|---|
| 2012/0280149 A1* | 11/2012 | Mestrom | H05G 2/001 250/492.1 |
| 2013/0088697 A1 | 4/2013 | Labetski et al. | |
| 2015/0029478 A1* | 1/2015 | Schimmel | G03F 7/70033 355/67 |
| 2016/0270199 A1* | 9/2016 | Iwamoto | H05G 2/006 |
| 2017/0215267 A1 | 7/2017 | Abe et al. | |

FOREIGN PATENT DOCUMENTS

| | | |
|---|---|---|
| JP | 2013-516773 A | 5/2013 |
| JP | 2013-526026 A | 6/2013 |
| JP | 2015-509646 A | 3/2015 |
| WO | 2015/099058 A1 | 7/2015 |
| WO | 2016/079838 A1 | 5/2016 |

OTHER PUBLICATIONS

International Preliminary Report on Patentability and Written Opinion issued in PCT/JP2017/003211; dated Jul. 30, 2019.

* cited by examiner

EXTREME ULTRAVIOLET LIGHT GENERATION APPARATUS

CROSS-REFERENCE TO RELATED APPLICATIONS

The present application is a continuation application of International Application No. PCT/JP2017/003211 filed on Jan. 30, 2017. The content of the application is incorporated herein by reference in its entirety.

BACKGROUND

1. Technical Field

The present disclosure relates to an extreme ultraviolet light generation apparatus.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure apparatus including an extreme ultraviolet light generation apparatus configured to generate extreme ultraviolet (EUV) light at a wavelength of 13 nm approximately in combination with reduced projection reflective optics.

Disclosed EUV light generation apparatuses include the three kinds of devices of a laser produced plasma (LPP) device that uses plasma generated by irradiating a target material with a laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: International Patent Publication No. 2016/079838
Patent Document 2: International Patent Publication No. 2015/099058
Patent Document 3: Japanese Unexamined Patent Application Publication No. 2004-6365

SUMMARY

An extreme ultraviolet light generation apparatus according to one aspect of the present disclosure includes: a chamber in which plasma is generated; a target supply unit configured to supply a droplet of a target substance to a plasma generation region in the chamber; a first pipe covering at least part of a trajectory of the droplet and having a first end part as an upstream end part and a second end part as a downstream end part in a trajectory direction of the droplet, both end parts being opened; a second pipe covering at least part of the first pipe with a gap between the second pipe and the at least part of the first pipe, one of both end parts of the second pipe being a third end part as a downstream end part in the trajectory direction of the droplet, the third end part being opened and extending downstream of the second end part of the first pipe in the trajectory direction; and a gas supply unit configured to supply gas flowing through the gap between the first pipe and the second pipe and cause the gas to flow in the trajectory direction out of a gas exit opened on the second end part side of the gap.

BRIEF DESCRIPTION OF THE DRAWINGS

Embodiments of the present disclosure will be described below as examples with reference to the accompanying drawings.

DESCRIPTION OF EMBODIMENTS

Table of Contents

1. Overall description of extreme ultraviolet light generation system
   1.1 Configuration
   1.2 Operation
2. Terms
3. EUV light generation apparatus including droplet generator
   3.1 Configuration
   3.2 Operation
4. Problems
   4.1 Problem 1
   4.2 Problem 2
5. First embodiment
   5.1 Configuration
   5.2 Operation
   5.3 Effects 6. Modification of first embodiment
    6.1 Configuration
    6.2 Operation
    6.3 Effects
7. Second embodiment
    7.1 Configuration
    7.2 Operation
    7.3 Effects
8. Third embodiment
    8.1 Configuration
    8.2 Specific designing example
    8.3 Operation
    8.4 Effects
9. Modification 1 of third embodiment
    9.1 Configuration
    9.2 Operation
    9.3 Effects
10. Modification 2 of third embodiment
    10.1 Configuration
    10.2 Operation
    10.3 Effects
11. Fourth embodiment
    11.1 Configuration
    11.2 Operation
    11.3 Effects
12. Debris reduction effect of gas flow
13. Reynolds number
14. Laser apparatus
15. Combination of embodiments Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

Figure 1:
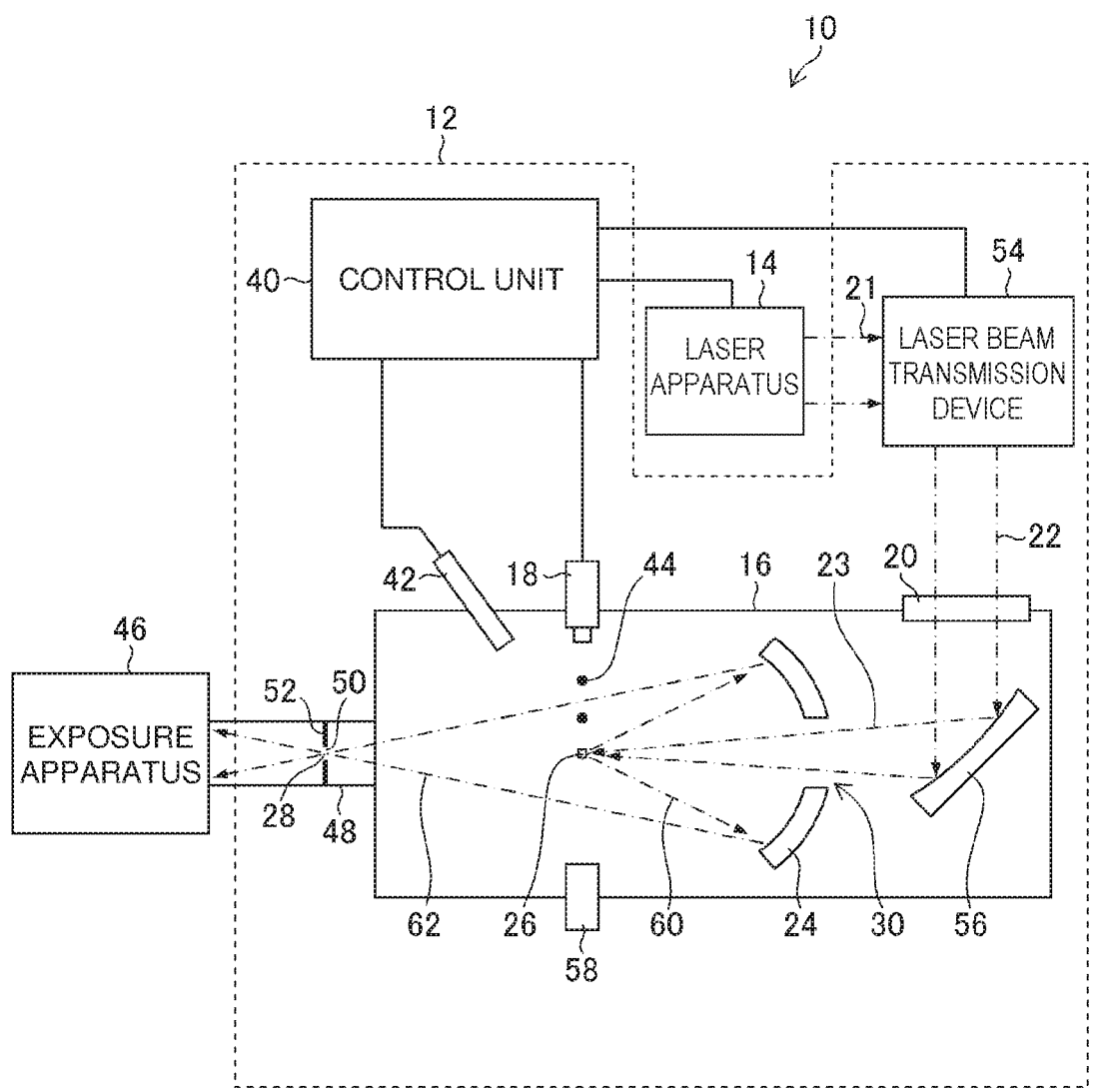
FIG. 1 is a diagram schematically illustrating the configuration of an exemplary LPP EUV light generation system.

1. Overall Description of Extreme Ultraviolet Light Generation System 1.1 Configuration FIG. 1 schematically illustrates the configuration of an exemplary LPP EUV light generation system 10. An EUV light generation apparatus 12 is used together with at least one laser apparatus 14 in some cases. In the present application, a system including the EUV light generation apparatus 12 and the laser apparatus 14 is referred to as the EUV light generation system 10. As illustrated in FIG. 1 and described below in detail, the EUV light generation apparatus 12 includes a chamber 16 and a target supply unit 18.

The chamber 16 is a sealable container. The target supply unit 18 supplies a target substance into the chamber 16, and is attached, for example, through a wall of the chamber 16. The material of the target substance may include tin, terbium, gadolinium, lithium, xenon, or a combination of any two of these materials, but is not limited thereto.

The wall of the chamber 16 is provided with at least one through-hole. The through-hole is blocked by a window 20 through which a pulse laser beam 22 output from the laser apparatus 14 transmits. For example, an EUV light focusing mirror 24 having a spheroidal reflective surface is disposed inside the chamber 16. The EUV light focusing mirror 24 has a first focal point and a second focal point. For example, a multi-layer reflective film obtained by alternately stacking molybdenum and silicon is formed on the surface of the EUV light focusing mirror 24. For example, the EUV light focusing mirror 24 is disposed so that the first focal point is positioned in a plasma generation region 26 and the second focal point is positioned at an intermediate focusing point (IF) 28. The EUV light focusing mirror 24 is provided with a through-hole 30 at a central part thereof, through which a pulse laser beam 23 passes.

The EUV light generation apparatus 12 includes a control unit 40, a target sensor 42, and the like. The target sensor 42 detects any one or a plurality of the existence, locus, position, and speed of a target 44. The target sensor 42 may have an image capturing function.

The EUV light generation apparatus 12 includes a connection unit 48 through which the inside of the chamber 16 and the inside of an exposure apparatus 46 communicate with each other. A wall 52 on which an aperture 50 is formed is provided inside the connection unit 48. The wall 52 is disposed so that the aperture 50 is positioned at the second focal point of the EUV light focusing mirror 24.

In addition, the EUV light generation apparatus 12 includes a laser beam transmission device 54, a laser beam focusing mirror 56, and a target recovery unit 58 for recovering the target 44, and the like. The laser beam transmission device 54 includes an optical element for defining the transmission state of a laser beam, and an actuator for adjusting the position, posture, and the like of the optical element. The target recovery unit 58 is disposed on the extended line of a direction in which the target 44 output into the chamber 16 travels.

The laser apparatus 14 may be a master oscillator power amplifier (MOPA) system. The laser apparatus 14 may include a master oscillator (not illustrated), a light isolator (not illustrated), and a plurality of $CO_2$ laser amplifiers (not illustrated). The master oscillator may be a solid-state laser. The wavelength of a laser beam output from the master oscillator is, for example, 10.59 μm, and the repetition frequency of pulse oscillation is, for example, 100 kHz.

1.2 Operation

The following describes the operation of the exemplary LPP EUV light generation system 10 with reference to FIG. 1. The inside of the chamber 16 is held at a pressure lower than the atmospheric pressure, and may be preferably a vacuum. Alternatively, gas having high transmissivity for EUV light may exist inside the chamber 16.

A pulse laser beam 21 output from the laser apparatus 14 passes through the laser beam transmission device 54 and is incident in the chamber 16 through the window 20 as the pulse laser beam 22. The pulse laser beam 22 travels inside the chamber 16 along at least one laser beam path, and is reflected by the laser beam focusing mirror 56 and incident on the at least one target 44 as the pulse laser beam 23.

The target supply unit 18 outputs the target 44 formed of the target material toward the plasma generation region 26 inside the chamber 16. The target supply unit 18 forms a droplet by, for example, a continuous jet scheme. In the continuous jet scheme, a nozzle is vibrated to provide standing wave to flow of the target substance ejected in a jet form through a nozzle hole, thereby periodically separating the target substance. The separated target substance forms a free interface due to surface tension thereof and forms into a droplet.

The target 44 is irradiated with at least one pulse included in the pulse laser beam 23. Plasma is generated when the target 44 is irradiated with the pulse laser beam, and radiates radiation light 60. EUV light 62 included in the radiation light 60 is selectively reflected by the EUV light focusing mirror 24. The EUV light 62 reflected by the EUV light focusing mirror 24 is focused at the intermediate focusing point 28 and output to the exposure apparatus 46. The single target 44 may be irradiated with a plurality of pulses included in the pulse laser beam 23.

The control unit 40 controls the entire EUV light generation system 10. The control unit 40 processes a result of detection by the target sensor 42. The control unit 40 may control, based on the result of detection by the target sensor 42, for example, a timing at which the target 44 is output, a direction in which the target 44 is output, and the like. In addition, the control unit 40 may control, for example, the oscillation timing of the laser apparatus 14, the traveling direction of the pulse laser beam 22, the focusing position of the pulse laser beam 23, and the like. These various kinds of control are merely exemplary, and may include another control as necessary.

In the present disclosure, the control unit 40 and any other control device can be achieved by hardware and software combination of one or a plurality of computers. The software is synonymous with a computer program. The computers conceptually include a programmable controller.

Functions of a plurality of control devices can be achieved by a single control device. In the present disclosure, the control unit 40 and the other control device may be connected with each other through a communication network including a local area network or the Internet. In a distributed computing environment, a computer program unit may be stored in local and remote memory storage devices.

2. Terms

"Pulse laser beam" may mean a laser beam containing a plurality of pulses.

"Laser beam" is not limited to a pulse laser beam, but may mean a general laser beam.

"Laser beam path" means the optical path of a laser beam.

"$CO_2$" represents carbon dioxide.

"Target" is an object irradiated with a laser beam introduced into the chamber. When irradiated with the laser beam, the target generates plasma and radiates EUV light. The target is the plasma generation source.

"Droplet" is a form of the target supplied into the chamber. The droplet is synonymous with the target in the droplet form. The droplet may mean the target deformed into a substantially spherical shape due to the surface tension of the melted target substance.

"Trajectory of a droplet" means a path on which the droplet travels. The trajectory of a droplet is referred to as "droplet trajectory" or simply referred to as "trajectory" in some cases.

"Trajectory direction of a droplet" means a direction parallel to the traveling direction of the droplet. In the trajectory direction of the droplet, "upstream side" refers to a side closer to the generation source of the droplet, and "downstream" refers to a side closer to the destination of the droplet. The phrases of "upstream side" and "downstream side" are used to describe a relative positional relation in the trajectory direction of the droplet in some cases.

"Plasma light" is radiation light radiated from a target as plasma. This radiation light includes EUV light.

"EUV light" stands for "extreme ultraviolet light".

"Piezoelectric element" is synonymous with dielectric element.

3. EUV Light Generation Apparatus Including Droplet Generator

3.1 Configuration

Figure 2:
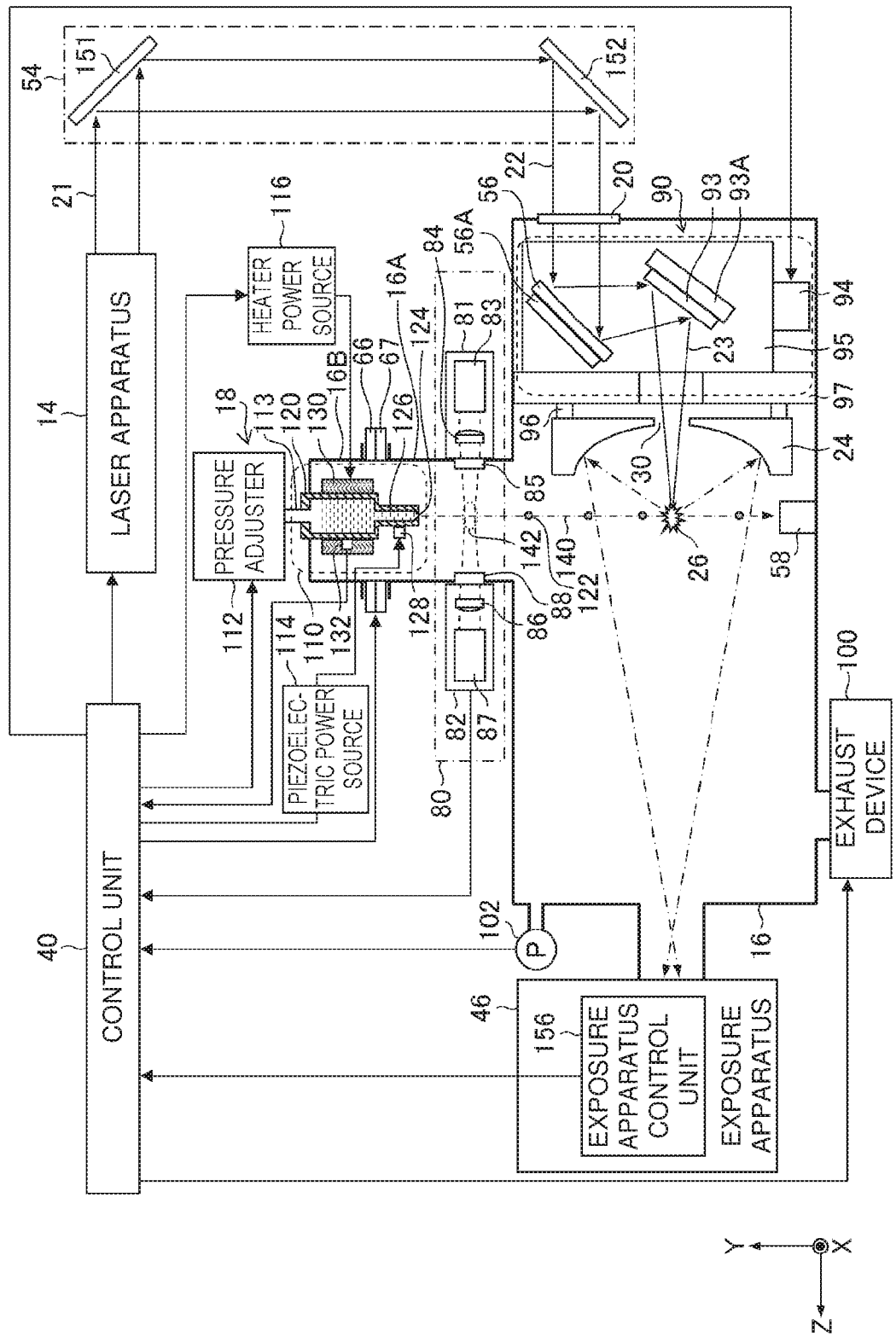
FIG. 2 is a diagram schematically illustrating the configuration of an EUV light generation apparatus including a droplet generator.

FIG. 2 is a diagram schematically illustrating the configuration of an EUV light generation apparatus including a droplet generator. In FIG. 2, for the purpose of description related to directions, an XYZ orthogonal coordinate axis is introduced. The direction of a Z axis is defined to be a direction in which EUV light is guided from the chamber 16 toward the exposure apparatus 46. An X axis and a Y axis are orthogonal to the Z axis and orthogonal to each other. The direction of the Y axis is defined to be the central axial direction of a nozzle 126 through which the target substance is output. The direction of the Y axis is the trajectory direction of a droplet. The direction of the X axis is defined to be a direction orthogonal to the sheet of FIG. 2. The coordinate axes introduced in FIG. 2 also apply to FIG. 3 and the following drawings.

The EUV light generation apparatus 12 includes the chamber 16, the laser beam transmission device 54, and the control unit 40. The EUV light generation apparatus 12 may include the laser apparatus 14.

The chamber 16 includes the target supply unit 18, a stage 66, a timing sensor 80, the window 20, a laser focusing optical system 90, the EUV light focusing mirror 24, the target recovery unit 58, an exhaust device 100, and a pressure sensor 102.

The target supply unit 18 includes a droplet generator 110, a pressure adjuster 112, a piezoelectric power source 114, and a heater power source 116. The pressure adjuster 112, the piezoelectric power source 114, and the heater power source 116 are each connected with the control unit 40.

The droplet generator 110 includes a tank 120 storing the target substance, the nozzle 126 including a nozzle hole 124 through which a droplet 122 of the target substance is output, and a piezoelectric element 128 installed near the nozzle 126. The droplet generator 110 also includes a heater 130 and a temperature sensor 132. The heater 130 and the temperature sensor 132 are disposed at an outer side surface part of the tank 120.

The temperature sensor 132 is connected with the control unit 40. The piezoelectric power source 114 is connected with the piezoelectric element 128. The heater power source 116 is connected with the heater 130.

The target substance is, for example, tin. At least the inside of the tank 120 contains a material unlikely to react with the target substance. Examples of materials unlikely to react with tin as an exemplary target substance include Mo, W, Ta, $Al_2O_3$, SiC, and $SiO_2$.

The pressure adjuster 112 is connected with the tank 120 through a pipe line 113. The pressure adjuster 112 is disposed on a pipe between an inert gas supply unit (not illustrated) and the tank 120. The inert gas supply unit may include a gas tank filled with inert gas such as helium or argon. The inert gas supply unit can supply the inert gas into the tank 120 through the pressure adjuster 112. The pressure adjuster 112 may be connected with a discharge pump (not illustrated). The pressure adjuster 112 includes an electromagnetic valve (not illustrated) for air supply and discharge, a pressure sensor (not illustrated), and the like. The pressure adjuster 112 detects pressure in the tank 120 by using the pressure sensor (not illustrated). The pressure adjuster 112 operates the discharge pump (not illustrated) to discharge gas in the tank 120.

The pressure adjuster 112 outputs a detection signal of detected pressure to the control unit 40. The control unit 40 supplies the pressure adjuster 112 with a control signal for controlling operation of the pressure adjuster 112 so that the pressure in the tank 120 becomes equal to a target pressure based on the detection signal output from the pressure adjuster 112.

The stage 66 can move the droplet generator 110 to a specified position at least on an XZ plane based on a command from the control unit 40.

The chamber 16 includes a first container 16A and a second container 16B. The second container 16B communicates with the first container 16A and is coupled with the first container 16A through the stage 66 and a support plate 67. The second container 16B is fixed to the stage 66.

The droplet generator 110 is fixed to the second container 16B. Specifically, the droplet generator 110 is fixed to the stage 66 through the second container 16B.

The support plate 67 is fixed to the first container 16A. The stage 66 can move at least in the XZ plane on the support plate 67. The first container 16A to which the support plate 67 is fixed is a fixed container fixed at a predetermined position. The second container 16B fixed to the stage 66 is a movable container that can move on the support plate 67. The droplet generator 110 can be moved to a position specified by the control unit 40 as the stage 66 moves on the support plate 67.

The timing sensor 80 includes a light source unit 81 and a light reception unit 82. The light source unit 81 and the light reception unit 82 are disposed facing each other with interposed therebetween a droplet trajectory 140 as a path on which the droplet 122 travels.

The light source unit 81 includes a light source 83 and an illumination optical system 84. The light source unit 81 is disposed to illuminate a droplet in a detection region 142 on the droplet trajectory 140 between the nozzle hole 124 of the droplet generator 110 and the plasma generation region 26. The light source 83 may be a laser beam source of single-color light or a lamp configured to emit light in a plurality of wavelengths. The light source 83 may include an optical fiber connected with the illumination optical system 84. The illumination optical system 84 includes a light focusing lens. The illumination optical system 84 may include a window 85. The window 85 is disposed on the wall of the chamber 16.

The light reception unit 82 of the timing sensor 80 includes a light receiving optical system 86 and an optical sensor 87. The light reception unit 82 is disposed to receive at least part of illumination light output from the light source unit 81 and having passed through the detection region 142. The light receiving optical system 86 includes a light focusing lens. The light receiving optical system 86 may include a window 88. The window 88 is disposed on the wall of the chamber 16.

The optical sensor 87 includes one or a plurality of light-receiving surfaces. The optical sensor 87 may be any of a photodiode, a photodiode array, an avalanche photodiode, a photomultiplier, a multi-pixel photon counter, and an image intensifier. The optical sensor 87 outputs an electric signal in accordance with received-light quantity.

The window 85 of the light source unit 81 and the window 88 of the light reception unit 82 are disposed at positions facing each other with the droplet trajectory 140 interposed therebetween. The direction in which the light source unit 81 and the light reception unit 82 face each other may be or may not be orthogonal to the droplet trajectory 140. The timing sensor 80 is an exemplary target sensor 42 illustrated in FIG. 1.

The laser beam transmission device 54 includes an optical element for defining the transmission state of a laser beam, and an actuator for adjusting the position, posture, and the like of the optical element. The laser beam transmission device 54 illustrated in FIG. 2 includes a first high reflectance mirror 151 and a second high reflectance mirror 152 as optical elements for defining the traveling direction of a laser beam.

The laser focusing optical system 90 is disposed so that the pulse laser beam 22 output from the laser beam transmission device 54 is input to the laser focusing optical system 90. The laser focusing optical system 90 is configured so that a laser beam incident on the chamber 16 through the window 20 is focused in the plasma generation region 26 through the laser focusing optical system 90. The laser focusing optical system 90 includes the laser beam focusing mirror 56, a high reflection planar mirror 93, and a laser beam manipulator 94.

The laser beam focusing mirror 56 is, for example, a high reflection off-axis parabolic mirror. The laser beam focusing mirror 56 is held by a mirror holder 56A. The mirror holder 56A is fixed to a plate 95. The high reflection planar mirror 93 is held by a mirror holder 93A. The mirror holder 93A is fixed to the plate 95.

The laser beam manipulator 94 includes, for example, a stage capable of moving the plate 95 in the directions of the three axes of the X axis, the Y axis, and the Z axis orthogonal to each other. The laser beam manipulator 94 can move a laser irradiation position in the chamber 16 to a position specified by the control unit 40 in the direction of each of the X axis, the Y axis, and the Z axis.

The EUV light focusing mirror 24 is held by an EUV light focusing mirror holder 96. The EUV light focusing mirror holder 96 is fixed to a plate 97. The plate 97 holds the laser focusing optical system 90 and the EUV light focusing mirror 24. The plate 97 is fixed to an inner wall of the chamber 16.

The EUV light focusing mirror 24 has a spheroidal reflective surface. The EUV light focusing mirror 24 has the first focal point and the second focal point. For example, a multi-layer reflective film obtained by alternately stacking molybdenum and silicon is formed on the surface of the EUV light focusing mirror 24. For example, the EUV light focusing mirror 24 is disposed so that the first focal point is positioned in the plasma generation region 26 and the second focal point is positioned at the intermediate focusing point (IF) 28. The EUV light focusing mirror 24 is provided with the through-hole 30 at the central part thereof, through which the pulse laser beam 23 passes.

The control unit 40 is connected with each of the laser apparatus 14, the target supply unit 18, the stage 66, the timing sensor 80, and the laser beam manipulator 94. In addition, the control unit 40 is connected with the exhaust device 100, the pressure sensor 102, and an exposure apparatus control unit 156. The exposure apparatus control unit 156 is a control device configured to control the exposure apparatus 46. The exposure apparatus control unit 156 may be included in the exposure apparatus 46.

3.2 Operation

The following describes operation of the exemplary LPP EUV light generation system 10 with reference to FIG. 2. The control unit 40 controls the exhaust device 100 so that the inside of the chamber 16 is a vacuum. The control unit 40 controls discharge by the exhaust device 100 and gas supply from a gas supply device (not illustrated) based on a value detected by the pressure sensor 102 so that the pressure in the chamber 16 is in a predetermined range.

The control unit 40 controls the exhaust device 100 to discharge gas in the chamber 16 so that a pressure equal to or lower than a predetermined pressure is achieved. The predetermined pressure may be, for example, one pascal [Pa]. In addition, the control unit 40 drives the heater 130 through the heater power source 116, and performs control to maintain, by heating, the target substance in the tank 120 at a predetermined temperature equal to or higher than the melting point thereof while monitoring temperature through the temperature sensor 132. When the target substance is tin, the predetermined temperature may be, for example, a temperature in the range of 250° C. to 290° C. The melting point of tin is 232° C. The target substance stored in the tank 120 melts into liquid through heating by using the heater 130.

The control unit 40 controls the pressure adjuster 112 so that the pressure in the tank 120 becomes equal to a predetermined pressure to discharge the liquid target substance through the nozzle hole 124. The predetermined pressure in the tank 120 may be, for example, equal to or larger than three megapascal [MPa].

The pressure adjuster 112 pressurizes or depressurizes the inside of the tank 120 by supplying gas into the tank 120 or discharging gas in the tank 120 based on a control signal from the control unit 40. The pressure in the tank 120 is adjusted to a target pressure by the pressure adjuster 112. Gas introduced into the tank 120 is preferably inert gas.

The pressure adjuster 112 adjusts, in accordance with an instruction from the control unit 40, the pressure in the tank 120 to a predetermined value so that the droplet 122 reaches the plasma generation region 26 at a predetermined target speed.

The predetermined target speed of the droplet may be, for example, a speed in the range of 60 m/s to 110 m/s. The predetermined value of the pressure of the tank 120 may be, for example, a pressure in the range of several MPa to 40 MPa. As a result, a jet of the liquid target substance is ejected from the nozzle hole 124 at the predetermined speed.

The control unit 40 performs control to supply drive voltage having a predetermined waveform to the piezoelectric element 128 through the piezoelectric power source 114. For example, the control unit 40 transfers, to the piezoelectric power source 114, an electric signal having a waveform of modulation wave obtained by modulating as carrier wave of a first period function by using a second period function. The modulation may be any of amplitude modulation, frequency modulation, and phase modulation. When a first frequency $f_c$ is the frequency of the first period function and a second frequency $f_m$ is the frequency of the second period function, the second frequency $f_m$ may be equal to or lower than the first frequency $f_c$.

The piezoelectric element 128 vibrates when the drive voltage is applied from the piezoelectric power source 114 to the piezoelectric element 128 in accordance with the electric signal having a waveform of modulation wave. The vibration of the piezoelectric element 128 provides vibration to the jet of the target substance ejected from the nozzle hole 124, and the jet of the target substance is separated into minute droplets in the period of $1/f_c$. These minute droplets have speeds different from each other attributable to waveform change in the period of $1/f_m$. A plurality of minute droplets are connected with each other due to this speed difference, thereby generating the droplets 122 having substantially uniform volumes in a predetermined period.

When V represents the average speed of the minute droplets, the distance between the minute droplets is $V/f_c$ approximately, and the distance between the droplets 122 each generated by connecting the minute droplets is $V/f_m$.

Each droplet 122 generated by the target supply unit 18 is detected by the timing sensor 80. The timing sensor 80 transfers a detection signal indicating the passing timing of the droplet 122 to the control unit 40.

The control unit 40 outputs a light emission trigger delayed from the detection signal of the droplet 122 by a predetermined delay time to the laser apparatus 14. Once the light emission trigger is input to the laser apparatus 14, the laser apparatus 14 outputs the pulse laser beam 21. The pulse laser beam 21 output from the laser apparatus 14 is input to the laser focusing optical system 90 through the laser beam transmission device 54 and the window 20.

The control unit 40 may control the stage 66 to move the droplet generator 110 so that the droplet 122 passes through the plasma generation region 26.

The control unit 40 controls the laser beam manipulator 94 so that the pulse laser beam 23 is focused in the plasma generation region 26. The pulse laser beam 23 is focused to be applied onto the droplet 122 in the plasma generation region 26 through the laser focusing optical system 90. This application of the focused pulse laser beam 23 onto the droplet 122 generates plasma from the target, thereby generating EUV light. The focused pulse laser beam 23 may be applied onto the droplet 122 supplied to the plasma generation region 26 from the target supply unit 18 in the predetermined period to periodically generate EUV light.

The EUV light generated from the plasma generation region 26 may be collected by the EUV light focusing mirror 24 and focused at the intermediate focusing point 28 before being input to the exposure apparatus 46.

The droplet 122 onto which no pulse laser beam 23 is applied passes through the plasma generation region 26 and enters the target recovery unit 58. The droplet 122 recovered by the target recovery unit 58 is stored as the liquid target substance.

4. Problems

4.1 Problem 1

Each droplet onto which the focused laser beam is applied in the plasma generation region instantaneously turns into plasma and expands. The trajectory of the droplet varies when generated debris adheres around the nozzle hole. To solve this problem, Patent Documents 1 and 2 disclose technologies of reducing adhesion of debris around the nozzle hole by using gas flow.

However, when the gas flow for reducing adhesion of debris around the nozzle hole includes flow orthogonal to the trajectory direction of the droplet, the trajectory of the droplet varies due to influence of the gas flow. When the trajectory of the droplet varies, the droplet may not pass through a focusing region of the timing sensor, and no light emission trigger may be generated. As a result, the pulse laser beam may not be applied onto the droplet, which stops EUV light generation.

4.2 Problem 2

The droplet generator outputs a plurality of minute droplets through the nozzle hole at different speeds by applying modulation wave voltage from the piezoelectric power source to the piezoelectric element, and connects the minute droplets due to the speed difference between the droplets, thereby generating a droplet in some cases. Such a droplet generation method using modulation wave is disclosed in, for example, Japanese Unexamined Patent Application Publication No. 2014-186846.

When a plurality of minute droplets having a speed difference are connected with each other during flight to generate droplets having substantially identical volumes in a constant period, connection defect can be caused by change of the traveling direction of each droplet due to gas flow before the connection of the minute droplets. In particular, the minute droplets yet to be connected are likely to be affected by gas flow, and the traveling direction thereof is likely to change. When the droplet connection defect occurs, EUV light cannot be stably generated.

5. First Embodiment

5.1 Configuration

Figure 3:
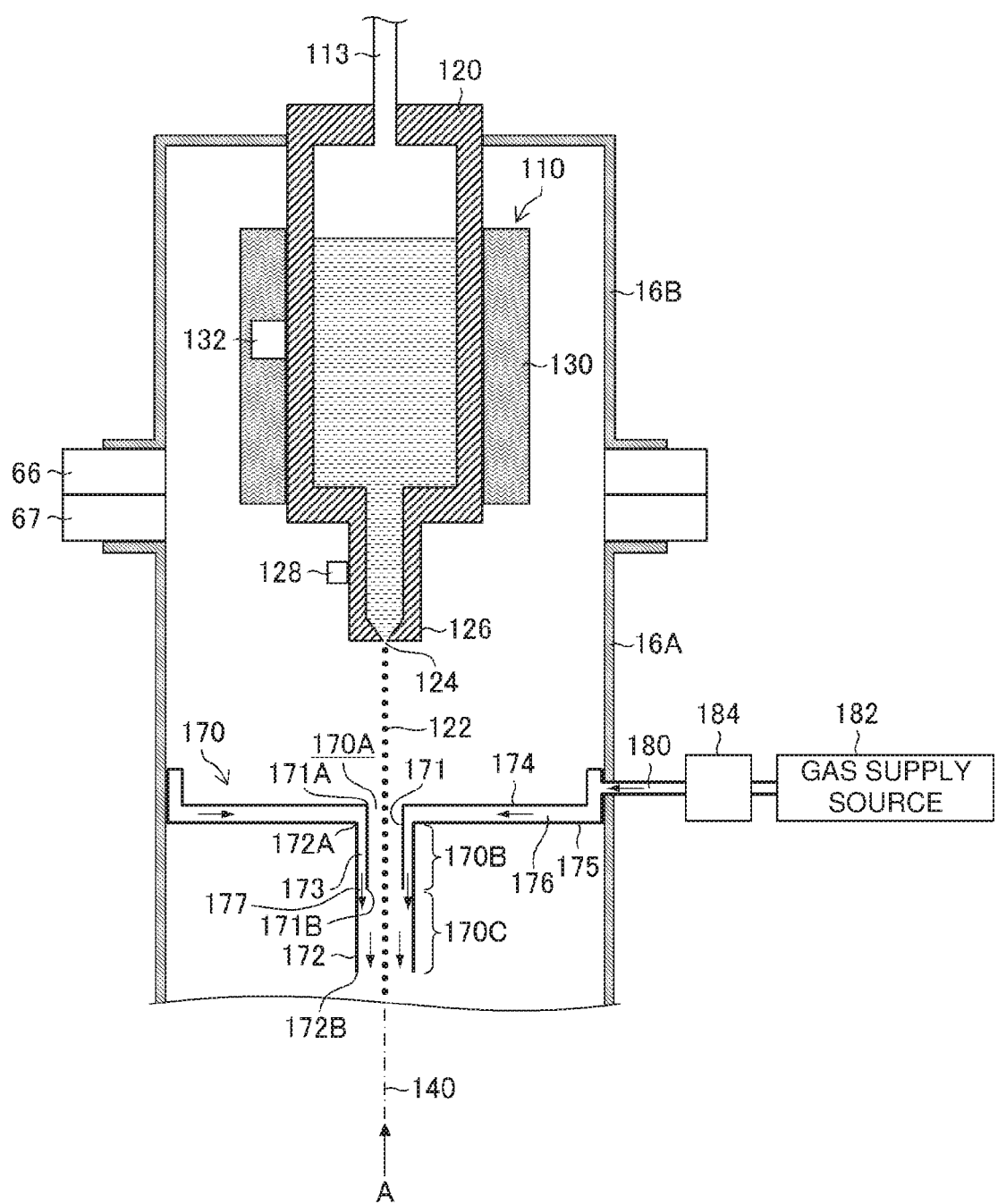
FIG. 3 is a diagram exemplarily illustrating the configuration of a main part of an EUV light generation apparatus according to a first embodiment.
Figure 4:
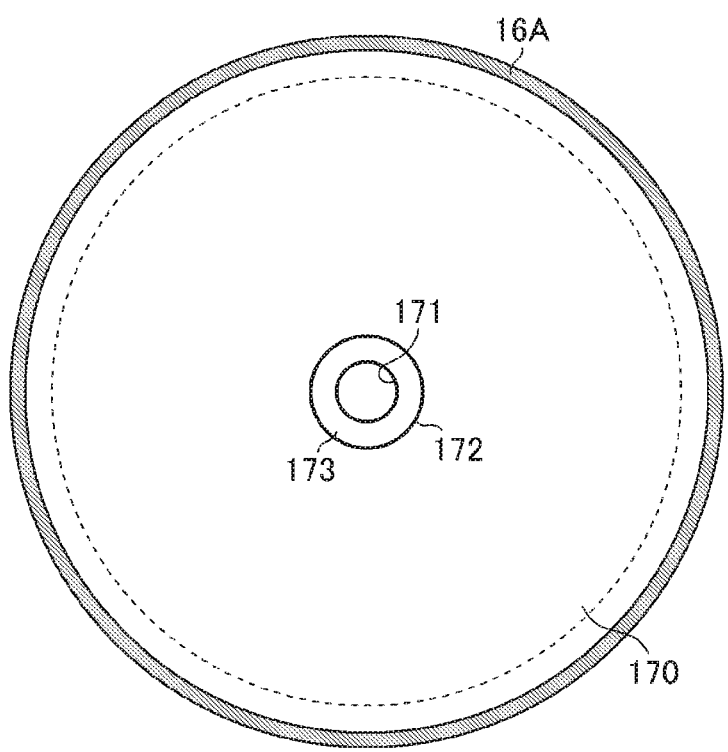
FIG. 4 is an Arrow A diagram when viewed in the direction of Arrow A in FIG. 3.

FIG. 3 exemplarily illustrates the configuration of a main part of the EUV light generation apparatus 12 according to a first embodiment. FIG. 3 illustrates the configuration of the vicinity of the droplet generator 110 in the EUV light generation apparatus 12. FIG. 4 is an Arrow A diagram when viewed in the direction of Arrow A in FIG. 3. The following describes difference from FIG. 2.

As illustrated in FIGS. 3 and 4, a gas introducing member 170 is disposed on the droplet trajectory 140 from the droplet generator 110 to the plasma generation region 26 in the chamber 16. The gas introducing member 170 is fixed to the inner wall of the chamber 16. The gas introducing member 170 according to the present embodiment is fixed to an inner wall of the first container 16A tubular along the droplet trajectory 140.

The gas introducing member 170 is provided with an opening 170A through which the droplet 122 passes. The opening 170A has opening area designed to have an appropriate size based on variance of the position of the droplet trajectory 140 and the movable range of the stage 66.

The opening 170A through which the droplet 122 passes is formed by a pipe structure covering at least part of the droplet trajectory 140. An upstream part of the pipe structure forming the opening 170A includes a double pipe part 170B having a double pipe structure, and a downstream part thereof includes a single pipe part 170C having a single pipe structure. In other words, the gas introducing member 170 includes a first pipe 171 and a second pipe 172. The first pipe 171 corresponds to an inner pipe, and the second pipe 172 corresponds to an outer pipe. The first pipe 171 and the second pipe 172 may be circular pipes.

The double pipe part 170B in the present embodiment is a double circular pipe part having a double circular pipe structure, and the single pipe part 170C is a single circular pipe part having a single circular pipe structure. A single pipe is synonymous with a onefold pipe.

The first pipe 171 is a tubular member covering at least part of the droplet trajectory 140. The first pipe 171 has an upstream end part 171A and a downstream end part 171B in the trajectory direction of the droplet 122, both end parts being opened.

The second pipe 172 is a tubular member covering at least part of the first pipe 171 with a gap 173 between the second pipe 172 and the at least part of the first pipe 171. The second pipe 172 has a downstream end part 172B opened among end parts in the trajectory direction of the droplet 122. The downstream end part 172B of the second pipe 172 extends downstream of the downstream end part 171B of the first pipe 171 in the trajectory direction. The single pipe part 170C is a downstream part of the second pipe 172 extending downstream of the downstream end part 171B of the first pipe 171 in the trajectory direction.

The flow rate of gas, the flow path cross-sectional area of the double pipe part 170B, and the length and flow path cross-sectional area of the single pipe part 170C are preferably determined so that the double pipe part 170B having the pipe structure has a Reynolds number equal to or smaller than a critical Reynolds number and the single pipe part 170C has a Peclet number equal to or larger than five. The critical Reynolds number is 2000 to 4000 for a circular pipe.

When Q [Pa·m³/s] represents the flow rate of gas, P [Pa] represents the pressure in the chamber, $S_1$ [m²] represents the flow path cross-sectional area of the double circular pipe part, $L_1$ [m] represents the characteristic length of the flow path of the double circular pipe part, $S_2$ [m²] represents the flow path cross-sectional area of the single circular pipe part having the circular pipe structure, and $L_2$ [m] represents the length of the single circular pipe, these values preferably have a relation indicated by Expressions (1) and (2) below. The characteristic length of the flow path of the double circular pipe part is twice of the gap between the inner pipe and the outer pipe.

[Expression 1]

$$\frac{QL_1}{PS_1} \leq 591 \quad (1)$$

[Expression 2]

$$\frac{QL_2}{S_2} \geq 40 \quad (2)$$

For example, the Reynolds number of the double circular pipe part is 1.8 and the Peclet number is 13.7 when the flow rate of gas is 200 sccm, the inner diameter of the flow path of the double circular pipe part is 12 mm, the outer diameter thereof is 14 mm, and the length of the single circular pipe part is 50 mm.

The double pipe part 170B preferably has a length sufficient for the direction of gas flow to become parallel to the droplet trajectory. The length of the double pipe part 170B may be, for example, 10 mm. Conditions preferable for the Reynolds number and the Peclet number are discussed in detail later.

The gas introducing member 170 according to the present embodiment includes a first shield member 174 extending at an outside part of the first pipe 171, and a second shield member 175 extending at an outside part of the second pipe 172. The first shield member 174 is connected with the upstream end part 171A of the first pipe 171, and covers the gap between the first pipe 171 and the inner wall of the first container 16A. The first pipe 171 and the first shield member 174 may be integrally formed as a single member, or may be formed as separate members and connected with each other.

The second shield member 175 is connected with an upstream end part 172A of the second pipe 172, and covers the gap between the second pipe 172 and the inner wall of the first container 16A. The second pipe 172 and the second shield member 175 may be integrally formed as a single member, or may be formed as separate members and connected with each other.

A gap as a gas introducing space 176 is provided between the first shield member 174 and the second shield member 175.

The gas introducing member 170 is connected with a gas supply source 182 through a pipe line 180. The pipe line 180 penetrates through the wall of the first container 16A and communicates with the gas introducing space 176 of the gas introducing member 170. A flow rate adjuster 184 may be provided between the gas introducing member 170 and the gas supply source 182. Gas supplied from the gas supply source 182 to the gas introducing member 170 may be, for example, hydrogen gas. The gas supply source 182 may be, for example, a hydrogen gas supply source including a hydrogen gas tank.

The material of the gas introducing member 170 may be, for example, stainless steel or aluminum. The material of the first pipe 171 and the second pipe 172 forming the opening 170A is preferably less reactive with the target substance. When the target substance is tin, the material of the first pipe 171 and the second pipe 172 is preferably Mo, W, Ta, $Al_2O_3$, SiC, or $SiO_2$. The surface of stainless steel or aluminum may be coated with the above-described material unlikely to react with the target substance.

5.2 Operation

The flow rate adjuster 184 controls the flow rate of gas supplied from the gas supply source 182 to a predetermined flow rate, and supplies the gas to the gas introducing member 170. The gas is introduced into the gas introducing space 176 of the gas introducing member 170 through the pipe line 180 penetrating through the wall of the chamber 16. The predetermined flow rate may be, for example, equal to or higher than 200 sccm. The term "sccm" stands for standard cc/min and means cc/min at 0° C. and 1 atm. The unit of sccm can be converted to a corresponding value, for example, in the SI unit by using the following relation: 1 sccm=$1.69 \times 10^{-3}$ Pa·$m^3$/s.

The gas introduced to the gas introducing member 170 is supplied from the gas introducing space 176 to the gap 173 between the first pipe 171 and the second pipe 172. The gas flowing inside the gas introducing member 170 is introduced from the double pipe part 170B into the chamber 16 as flow parallel to the trajectory direction of the droplet 122.

The gas having flowed through the gap 173 of the double pipe part 170B flows out of a gas exit 177 opened at the downstream end part 171B of the first pipe 171 into the second pipe 172 as flow parallel to the trajectory direction.

The gas introduction to the gas introducing member 170 may be performed after discharge of the droplet 122.

The upstream end part 171A of the first pipe 171 corresponds to an exemplary "first end part". The downstream end part 171B of the first pipe 171 corresponds to an exemplary "second end part". The downstream end part 172B of the second pipe 172 corresponds to an exemplary "third end part". The gas supply source 182 corresponds to an exemplary "gas supply unit". At least one of the flow rate adjuster 184 and the pipe line 180 may be included in the exemplary "gas supply unit".

5.3 Effects

Debris generated from the droplet 122 onto which the focused pulse laser beam 23 is applied in the plasma generation region 26 is prevented from moving in a direction toward the nozzle hole 124 by flow of the gas ejected from the gas exit 177. Accordingly, the debris can be prevented from adhering around the nozzle hole 124.

The gas flowing out of the gas exit 177 through the gap 173 between the first pipe 171 and the second pipe 172 flows parallel to the droplet trajectory 140, and thus the trajectory of the droplet 122 can be prevented from varying due to the gas flow.

6. Modification of the First Embodiment 6.1 Configuration

Figure 5:
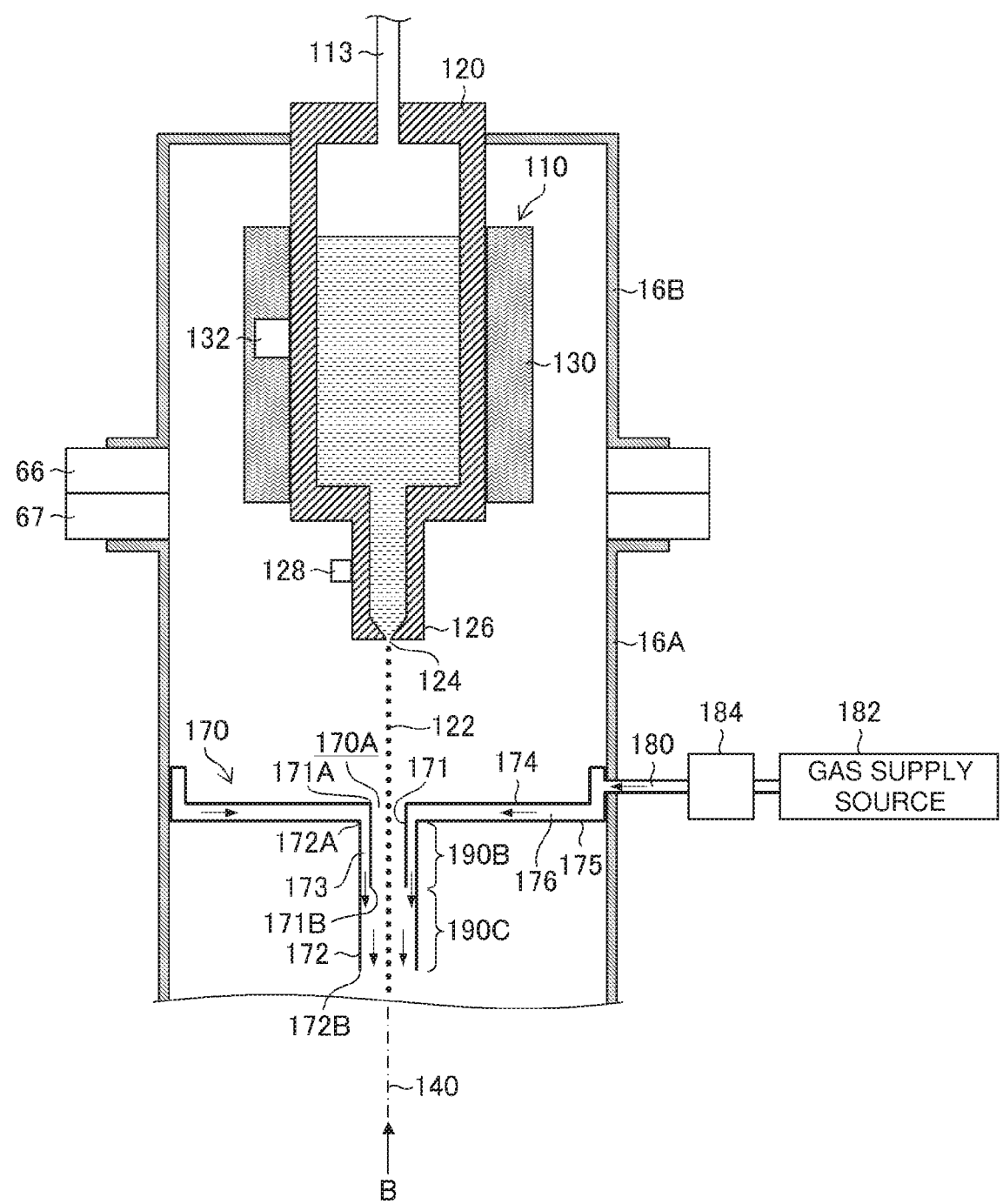
FIG. 5 is a diagram illustrating a modification of the first embodiment.
Figure 6:
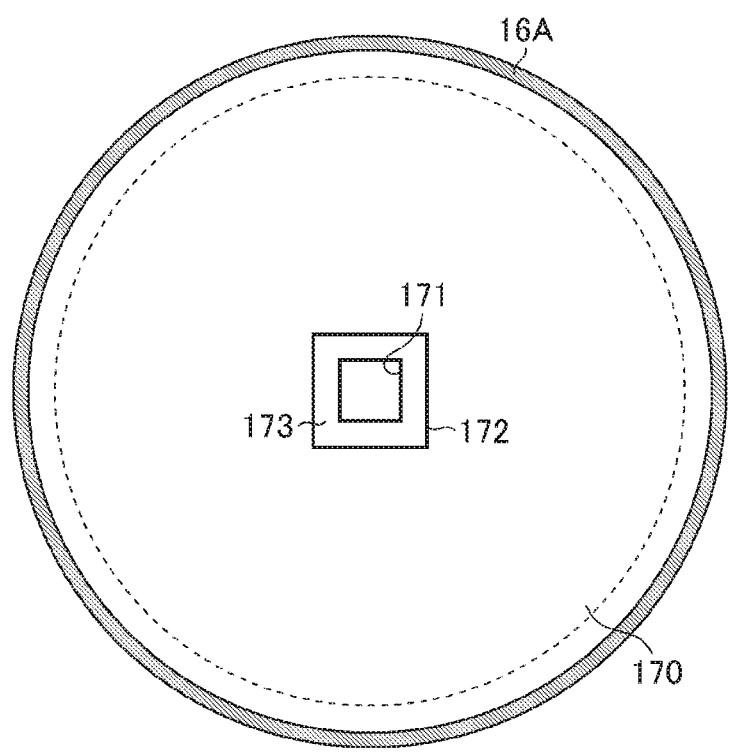
FIG. 6 is an Arrow B diagram when viewed in the direction of Arrow B in FIG. 5.

FIGS. 5 and 6 illustrate a modification of the first embodiment. FIG. 6 is an Arrow B diagram when viewed in the direction of Arrow B in FIG. 5. In FIGS. 5 and 6, any component identical or similar to that in the configuration illustrated in FIGS. 3 and 4 is denoted by an identical reference sign, and description thereof will be omitted. The following describes difference from the configuration of the first embodiment illustrated in FIGS. 3 and 4.

As illustrated in FIGS. 5 and 6, the opening 170A through which a droplet passes may be formed of a rectangular pipe structure covering part of the droplet trajectory 140. A doubly rectangular pipe part 190B is provided upstream of the rectangular pipe structure, and a single rectangular pipe part 190C is provided downstream thereof.

The flow rate of gas, the flow path cross-sectional area of the doubly rectangular pipe part 190B, and the length and flow path cross-sectional area of the single rectangular pipe part 190C are preferably determined so that the doubly rectangular pipe part 190B having a rectangular pipe structure has a Reynolds number equal to or smaller than the critical Reynolds number and the single rectangular pipe part 190C has a Peclet number equal to or larger than five.

For example, the Reynolds number of the doubly rectangular pipe part is 1.5 and the Peclet number is 10.8 when the flow rate of gas is 200 sccm, the inner dimension and outer dimension of the flow path of the doubly rectangular pipe part are 12 mm and 14 mm, respectively, and the length of the single rectangular pipe part is 50 mm.

The doubly rectangular pipe part 190B preferably has a length sufficient for the direction of gas flow to become parallel to the droplet trajectory 140. The length of the doubly rectangular pipe part 190B is, for example, 10 mm.

6.2 Operation

Operation of the modification illustrated in FIGS. 5 and 6 is same as the operation of the first embodiment illustrated in FIGS. 3 and 4.

6.3 Effects

The modification illustrated in FIGS. 5 and 6 achieves effects same as those of the first embodiment illustrated in FIGS. 3 and 4. In addition, with the configuration illustrated in FIGS. 5 and 6, the movable range of the stage 66 of the droplet generator 110 can be increased as compared to the first embodiment employing a circular pipe structure, with the same outer dimension of pipe parts.

7. Second Embodiment 7.1 Configuration

Figure 7:
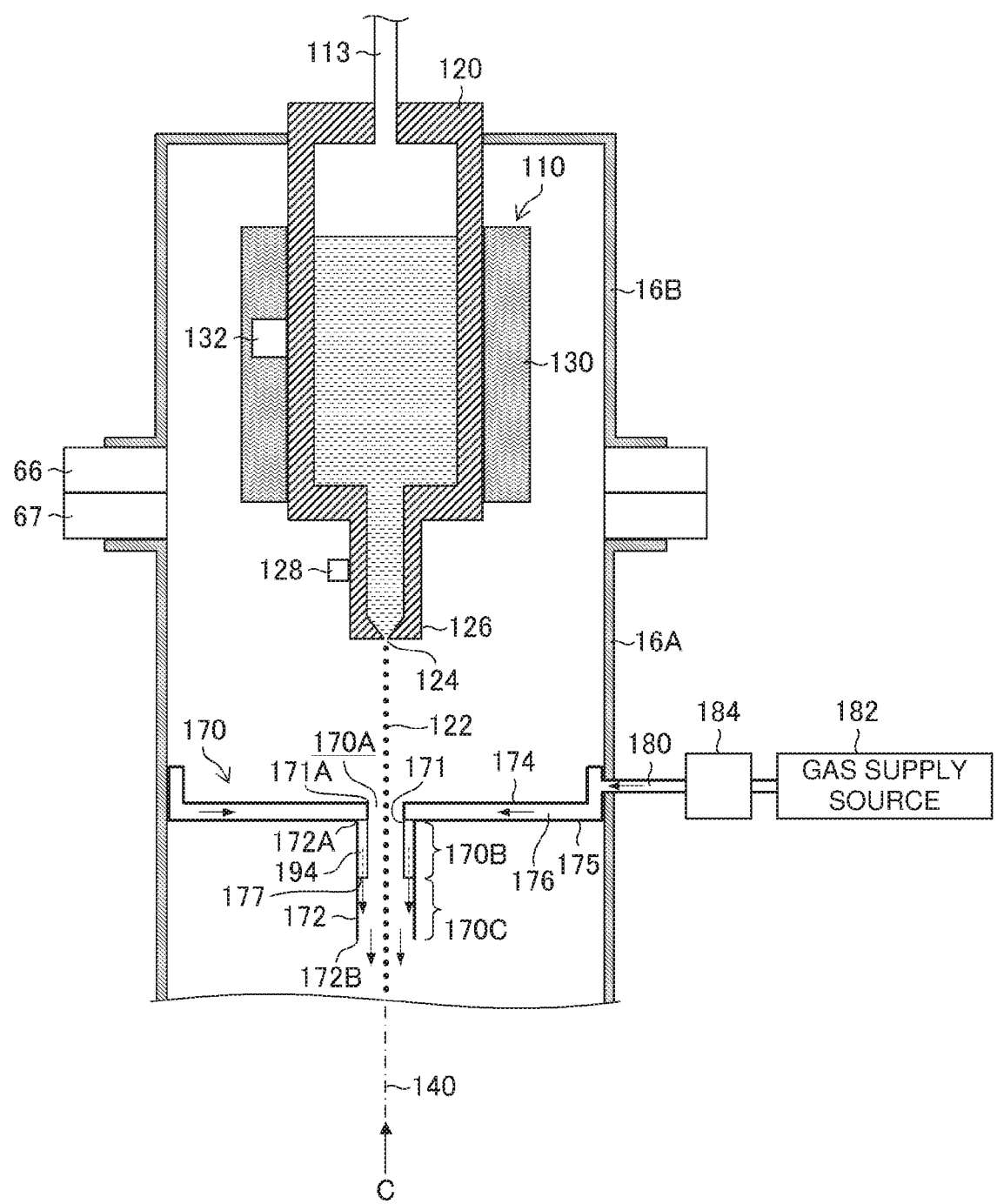
FIG. 7 is a diagram exemplarily illustrating the configuration of a main part of an EUV light generation apparatus according to a second embodiment.
Figure 8:
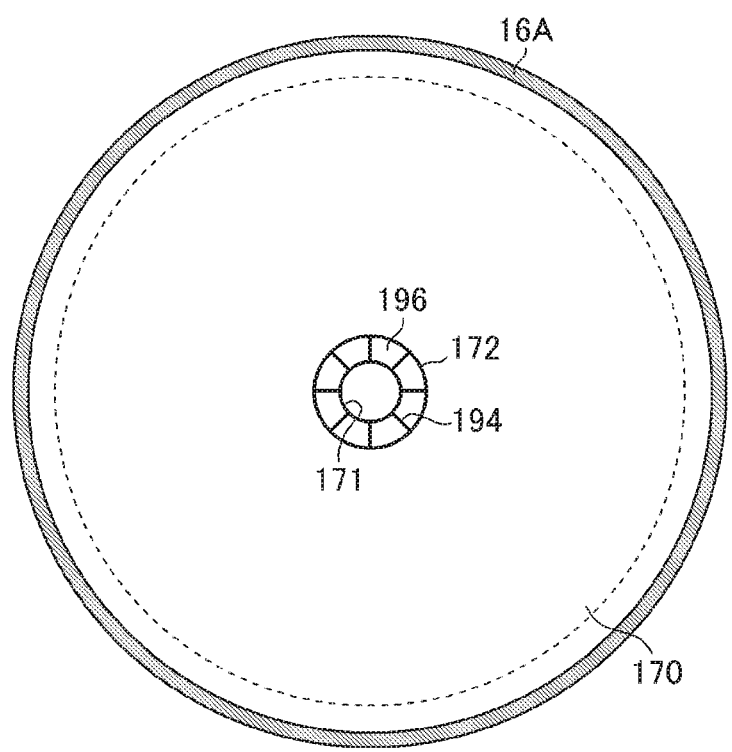
FIG. 8 is an Arrow C diagram when viewed in the direction of Arrow C in FIG. 7.

FIGS. 7 and 8 illustrate a second embodiment. FIG. 8 is an Arrow C diagram when viewed in the direction of Arrow C in FIG. 7. In FIGS. 7 and 8, any component identical or similar to that in the configuration of the first embodiment illustrated in FIGS. 3 and 4 is denoted by an identical reference sign, and description thereof will be omitted. The following describes difference from the configuration of the first embodiment illustrated in FIGS. 3 and 4.

The gas introducing member 170 includes a partition 194 parallel to the droplet trajectory 140 in the double pipe part 170B upstream of the circular pipe structure. The partition 194 is disposed at least at two places to divide the flow path at the double pipe part 170B into two or more flow paths 196. FIG. 8 illustrates an example in which the partitions 194 are disposed at eight places separated from each other by an equal angle in the circumferential direction. The eight partitions 194 are radially disposed from the central axis of the double pipe part 170B in the radial direction. The eight partitions 194 partition the gas flow path in the double pipe part 170B into the eight flow paths 196.

Each partition 194 preferably has a small thickness. Decrease of the flow path cross-sectional area is reduced as the thickness of the partition 194 is smaller. The partition 194 may have a thickness of, for example, 1 mm.

7.2 Operation

Operation of the second embodiment is same as the operation of the first embodiment.

7.3 Effects

The second embodiment achieves effects same as those of the first embodiment illustrated in FIGS. 3 and 4. In addition, the partitions 194 rectify gas flow in a direction parallel to the droplet trajectory 140. With the configuration of the second embodiment, the length of the double pipe part 170B can be shorter than that in the first embodiment. Accordingly, the length of the pipe structure part of the gas introducing member 170 can be shortened.

8. Third Embodiment

8.1 Configuration

Figure 9:
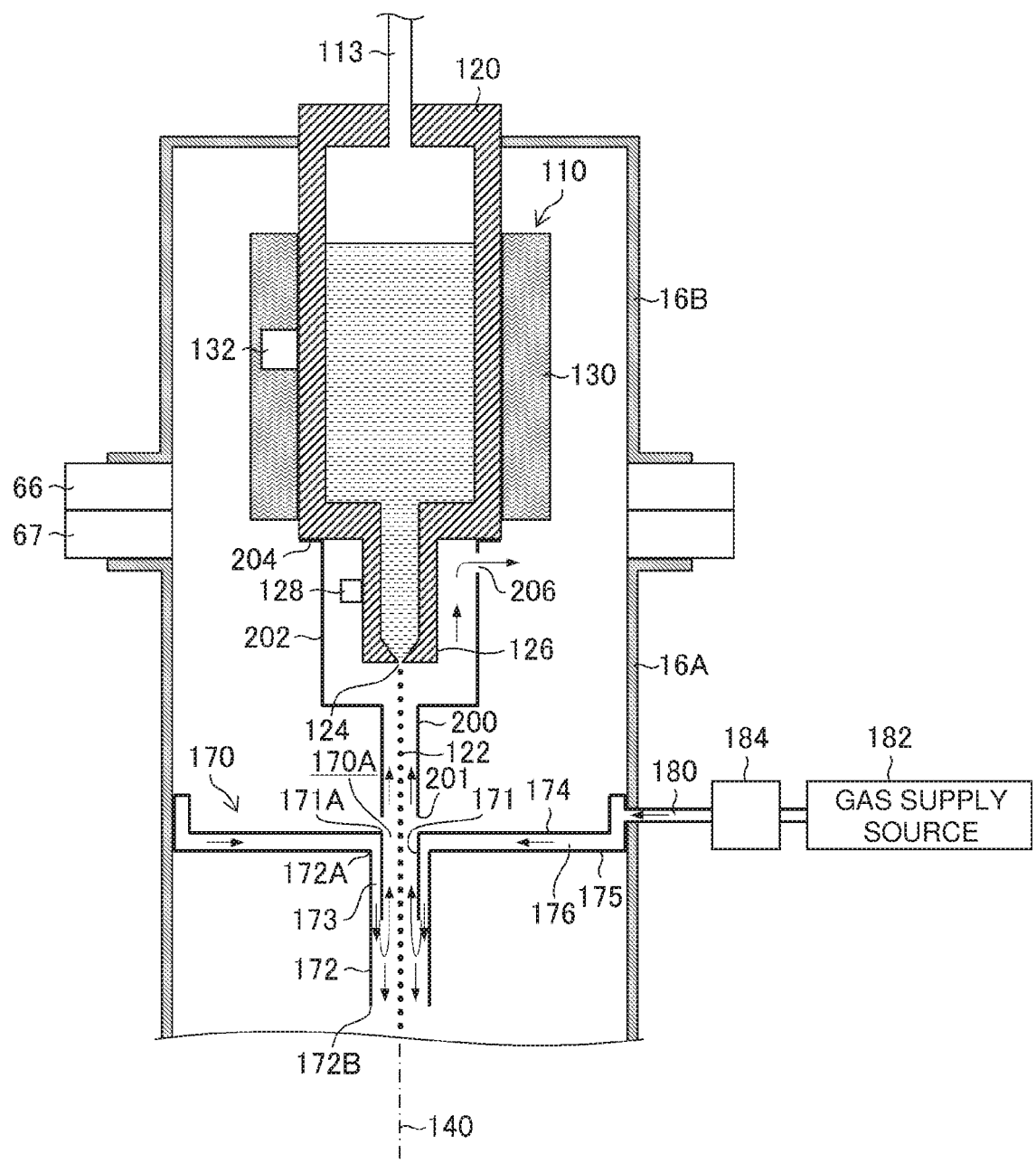
FIG. 9 is a diagram exemplarily illustrating the configuration of a main part of an EUV light generation apparatus according to a third embodiment.

FIG. 9 illustrates a third embodiment. In FIG. 9, any component identical or similar to that in the configuration of the first embodiment illustrated in FIGS. 3 and 4 is denoted by an identical reference sign, and description thereof will be omitted. The following describes difference from the configuration of the first embodiment illustrated in FIGS. 3 and 4.

The EUV light generation apparatus 12 according to the third embodiment may include a tube 200 covering part of the droplet trajectory 140 near the nozzle 126 of the droplet generator 110.

The inner diameter of the tube 200 may be equal to the inner diameter of the first pipe 171 as the inner pipe of the double pipe part 170B of the gas introducing member 170. A downstream end part 201 among end parts of the tube 200 is opened. The downstream end part 201 of the tube 200 is not in contact with the first pipe 171.

The length of the tube 200 is preferably set as long as possible without contact with the gas introducing member 170. For example, the length of the gap between the downstream end part 201 of the tube 200 and the gas introducing member 170 may be 5 mm.

The tube 200 includes a tubular cover 202 covering the nozzle 126 on a side opposite to the downstream end part 201. An attachment part 204 is provided at an upstream end part of the cover 202. The tube 200 is fixed to the droplet generator 110 through the attachment part 204. The attachment part 204 is provided at a position farther from the first pipe 171 in the trajectory direction of the droplet 122 than the nozzle hole 124.

An opening 206 is provided near the attachment part 204 of the cover 202. The opening 206 is preferably positioned on the tank 120 side of the nozzle hole 124. In other words, the opening 206 is preferably provided at a position farther from the downstream end part 201 of the tube 200 in the trajectory direction of the droplet 122 than the nozzle hole 124.

The cover 202 may be provided with a plurality of openings 206. The openings 206 may be provided at positions line symmetric with respect to two orthogonal axes on a plane having an intersection point on the droplet trajectory 140 and orthogonal to the droplet trajectory 140.

8.2 Specific Designing Example

Figure 10:
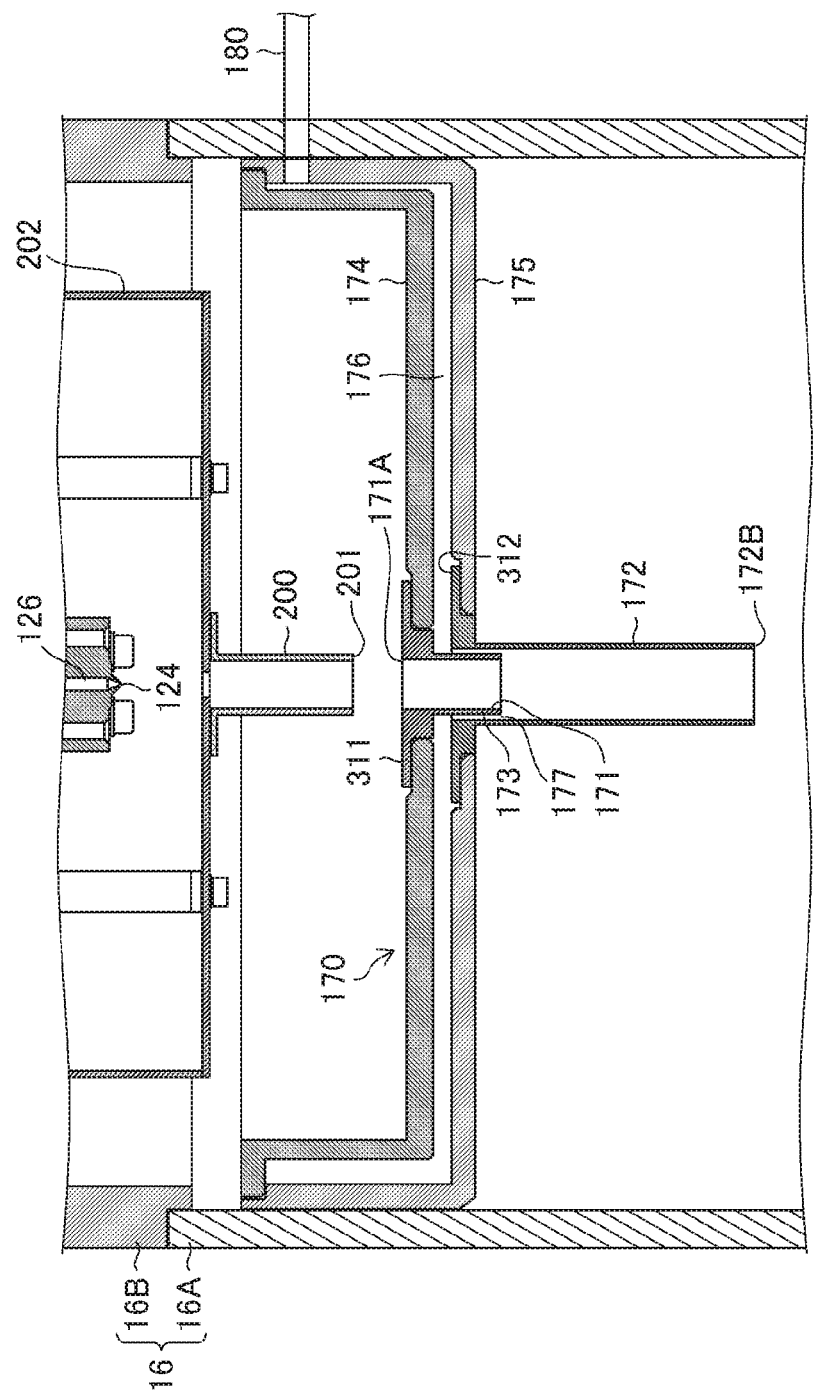
FIG. 10 is a cross-sectional view illustrating a specific designing example related to the third embodiment.

FIG. 10 is a cross-sectional view illustrating a specific designing example related to the third embodiment. In FIG. 10, any component identical or similar to that in the configuration illustrated in FIG. 9 is denoted by an identical reference sign, and description thereof will be omitted. A first flange part 311 is provided at the upstream end part 171A of the first pipe 171. The first flange part 311 is coupled with the first shield member 174 by using a bolt (not illustrated). The first shield member 174 is coupled with the second shield member 175 by using a bolt (not illustrated) near the inner wall of the chamber 16.

A second flange part 312 is provided at the upstream end part 172A of the second pipe 172. The second flange part 312 is coupled with the second shield member 175 by using a bolt (not illustrated). The second shield member 175 is fixed to the inner wall of the first container 16A of the chamber 16 by using a bolt (not illustrated).

The cover 202 covers around the nozzle 126. The cover 202 is coupled with the tube 200 by using a bolt (not illustrated).

8.3 Operation

The flow rate adjuster 184 controls the flow rate of gas introduced to the gas introducing member 170 to a predetermined flow rate. The predetermined flow rate may be, for example, equal to or higher than 200 sccm. The gas controlled to the predetermined flow rate by the flow rate adjuster 184 is introduced to the gas introducing member 170 through the pipe line 180 penetrating through the wall of the chamber 16.

The gas flowing inside the gas introducing member 170 is introduced from the double pipe part 170B into the chamber 16 as flow parallel to the trajectory direction of the droplet 122.

Part of the gas introduced in the chamber 16 flows toward the droplet generator 110 inside the inner pipe of the double pipe part 170B. The direction from the double pipe part 170B toward the droplet generator 110 is a direction toward the upstream side in the trajectory direction of the droplet 122. The gas flowing toward the droplet generator 110 inside the inner pipe of the double pipe part 170B flows inside the tube 200 and flows into the chamber 16 through the opening 206.

The gas introduction to the gas introducing member 170 may be performed after discharge of the droplet 122.

The tube 200 or the tube 200 including the cover 202 corresponds to an exemplary "tubular member". The downstream end part 201 of the tube 200 corresponds to an exemplary "fourth end part". The upstream end part of the cover 202 corresponds to an exemplary "fifth end part".

8.4 Effects

The tube 200 disposed to cover the droplet trajectory 140 near the nozzle 126 regulates the flow direction of gas flowing inside the inner pipe of the double pipe part 170B toward the droplet generator 110. Accordingly, the gas flow toward the droplet generator 110 has reduced flow orthogonal to the trajectory direction of the droplet.

Thus, the third embodiment can further reduce variation of the droplet trajectory due to gas flow than the first embodiment.

9. Modification 1 of the Third Embodiment

9.1 Configuration

Figure 11:
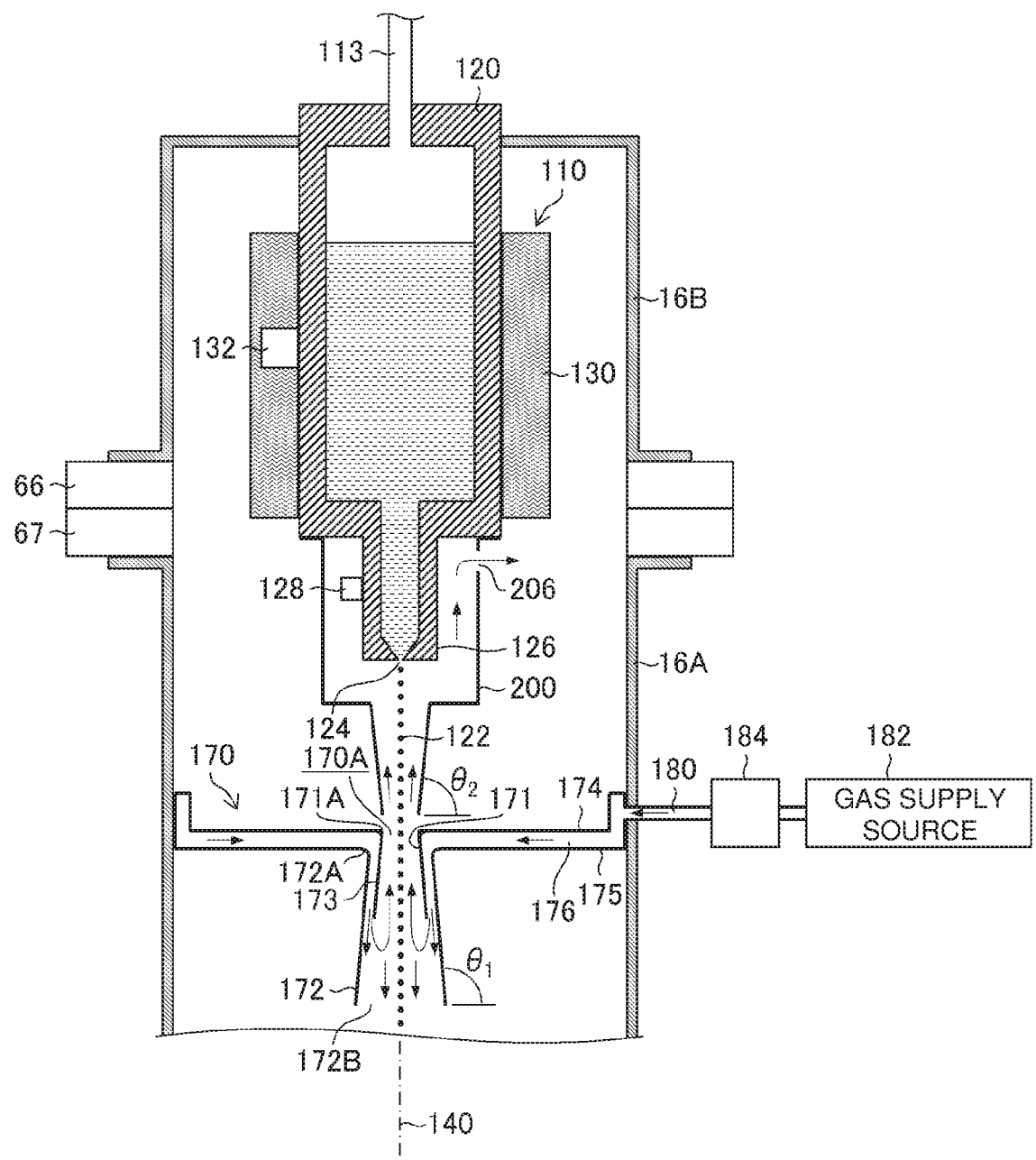
FIG. 11 is a diagram illustrating Modification 1 of the third embodiment.

FIG. 11 illustrates Modification 1 of the third embodiment. In FIG. 11, any component identical or similar to that in the configurations illustrated in FIGS. 9 and 10 and FIGS. 3 and 4 is denoted by an identical reference sign, and description thereof will be omitted. The following describes difference from the configuration of the third embodiment illustrated in FIG. 9.

The sidewall of each of the first pipe 171 and the second pipe 172 forming the opening 170A of the gas introducing member 170 may be non-parallel to the trajectory direction of the droplet trajectory 140, and the flow path cross-sectional area in the pipe may increase as gas flow travels downstream in the trajectory direction.

For example, an angle $\theta_1$ illustrated in FIG. 11 may be 90° to 100°. The angle $\theta_1$ is an angle at which the sidewall of the first pipe 171 or the second pipe 172 intersects with a reference line orthogonal to the trajectory direction of the droplet trajectory 140. The angle $\theta_1$ is an intersection angle defined by the reference line extending outside the second pipe 172 and the sidewall upstream of the reference line in the trajectory direction.

The sidewall of the tube 200 may be non-parallel to the trajectory direction of the droplet trajectory 140, and the flow path cross-sectional area in the pipe may increase as gas flow travels upstream in the trajectory direction. For example, an angle $\theta_2$ illustrated in FIG. 11 may be 80° to 90°. The angle $\theta_2$ is an angle at which the sidewall of the tube 200 intersects with the reference line orthogonal to the trajectory direction of the droplet trajectory 140. The angle $\theta_2$ is an intersection angle defined by the reference line extending outside the tube 200 and the sidewall upstream of the reference line in the trajectory direction.

9.2 Operation

Operation of Modification 1 illustrated in FIG. 11 is same as the operation of the third embodiment illustrated in FIG. 9.

9.3 Effects

Modification 1 achieves an increased freedom of designing in addition to the effects of the third embodiment.

10. Modification 2 of the Third Embodiment 10.1 Configuration

Figure 12:
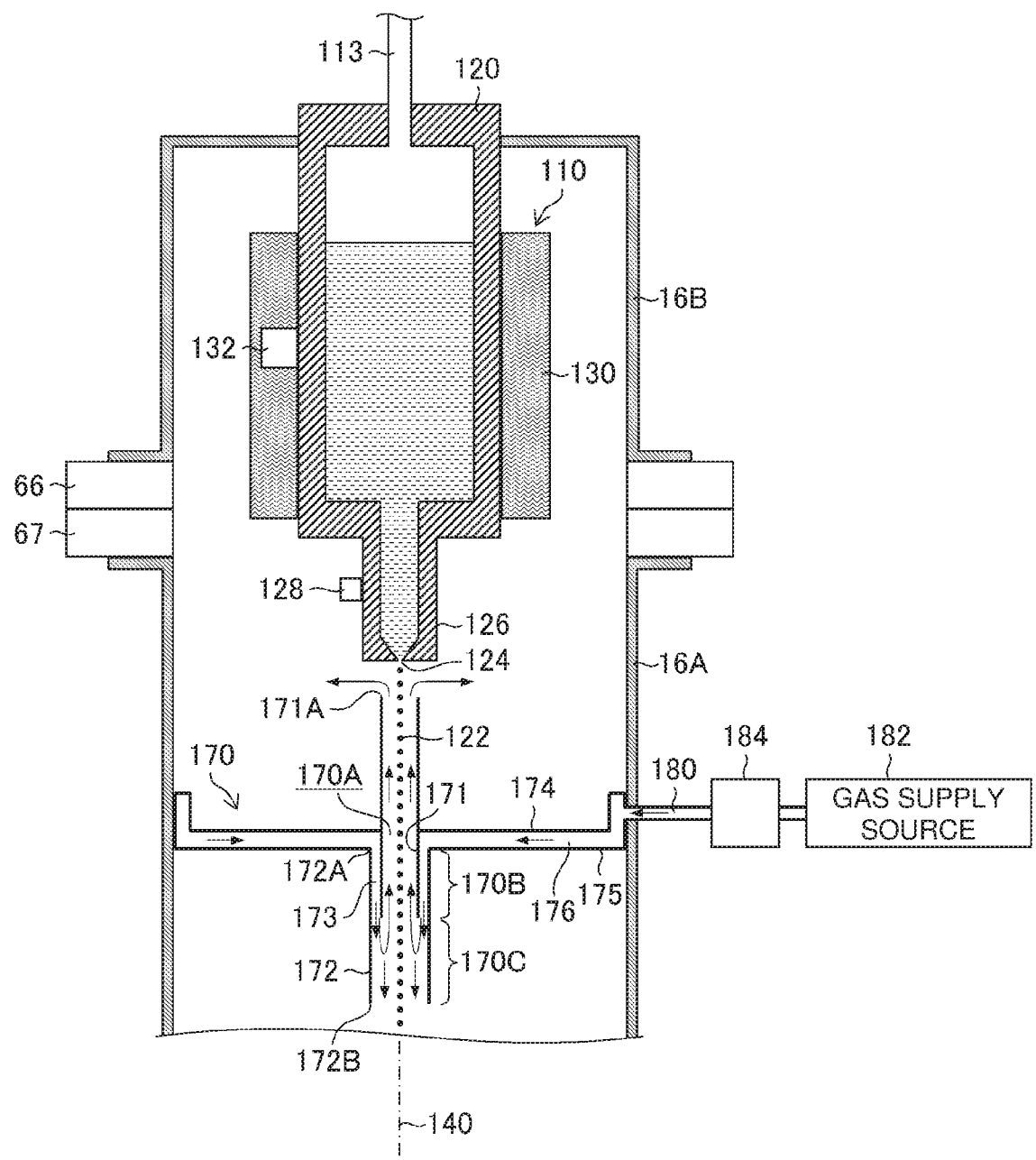
FIG. 12 is a diagram illustrating Modification 2 of the third embodiment.

FIG. 12 illustrates Modification 2 of the third embodiment. In FIG. 12, any component identical or similar to that in the configurations illustrated in FIGS. 9 and 10 and FIGS. 3 and 4 is denoted by an identical reference sign, and description thereof will be omitted. The following describes difference from the configuration of the third embodiment illustrated in FIG. 9.

In place of the tube 200 illustrated in FIG. 9, the first pipe 171 as an inner pipe of a double pipe may be extended farther from the first shield member 174 toward the droplet generator 110 as illustrated in FIG. 12.

The gap between the first pipe 171 extended toward the droplet generator 110 and the nozzle 126 may have a length sufficient for gas flow through the first pipe 171. For example, the gap between the upstream end part 171A of the first pipe 171 and the droplet generator 110 may have a length of 10 mm.

10.2 Operation

The flow rate adjuster 184 controls the flow rate of gas introduced to the gas introducing member 170 to a predetermined flow rate. The predetermined flow rate may be, for example, equal to or higher than 200 sccm. The gas controlled to the predetermined flow rate by the flow rate adjuster 184 is introduced to the gas introducing member 170 through the pipe line 180 penetrating through the wall of the chamber 16.

The gas flowing inside the gas introducing member 170 is introduced from the double pipe part 170B into the chamber 16 as flow parallel to the trajectory direction of the droplet 122.

Part of the gas introduced in the chamber 16 flows inside the first pipe 171 as the inner pipe having a doubly pipe structure toward the droplet generator 110. The gas flowing inside the first pipe 171 flows, near the nozzle 126, into the chamber 16 through the opening of the first pipe 171 on the nozzle 126 side.

The gas introduction to the gas introducing member 170 may be performed after discharge of the droplet 122.

10.3 Effects

According to Modification 2, the first pipe 171 extends to the vicinity of the nozzle 126 toward the droplet generator 110 and covers the droplet trajectory 140. The first pipe 171 regulates the flow direction of gas flowing toward the droplet generator 110 inside the pipe. Accordingly, the gas flow toward the droplet generator 110 has reduced flow orthogonal to the trajectory direction of the droplet.

Thus, Modification 2 of the third embodiment can further reduce variation of the droplet trajectory due to gas flow than the first embodiment. In addition, Modification 2 achieves a compact configuration as compared to the third embodiment.

11. Fourth Embodiment 11.1 Configuration

Figure 13:
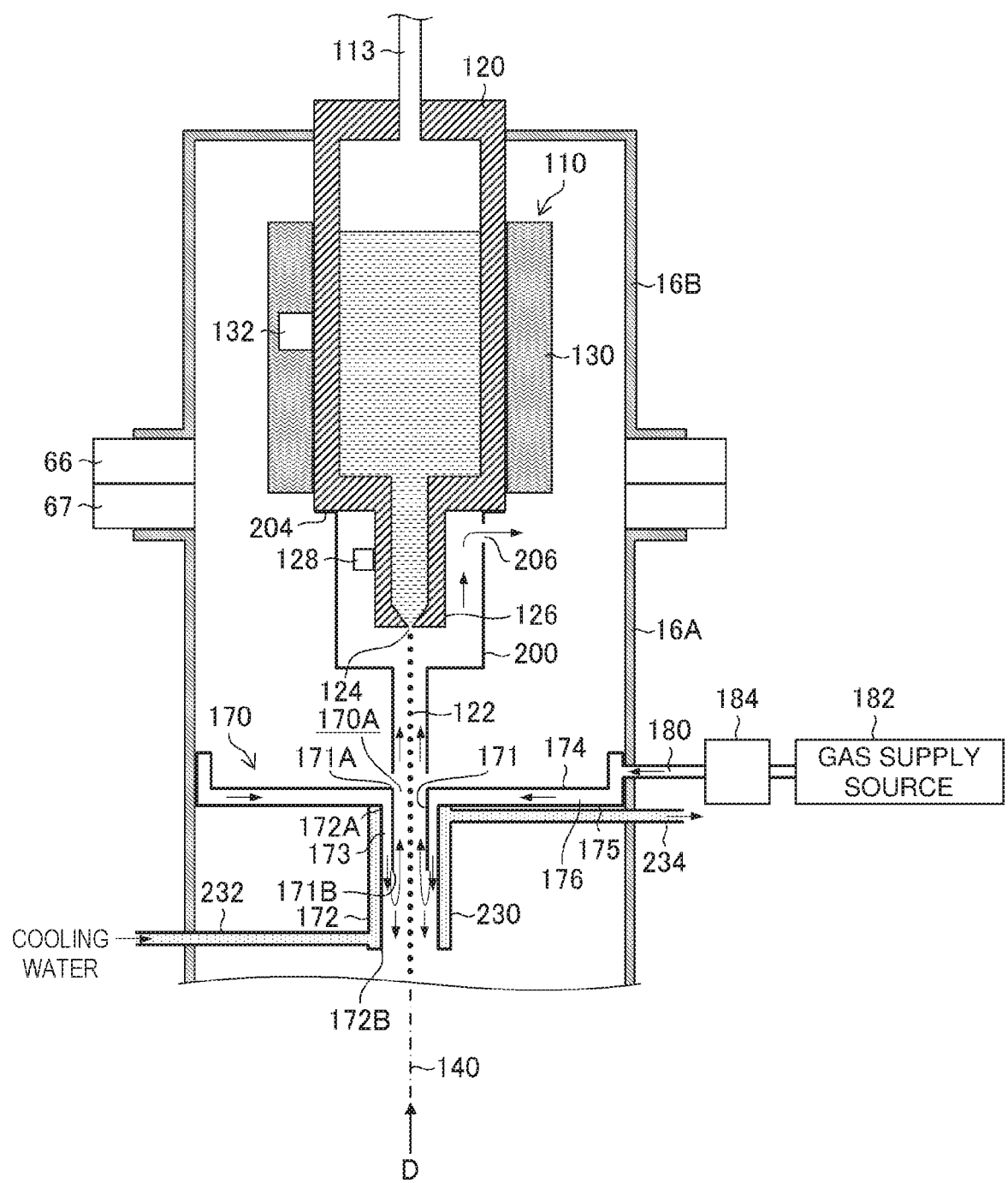
FIG. 13 is a diagram exemplarily illustrating the configuration of a main part of an EUV light generation apparatus according to a fourth embodiment.
Figure 14:
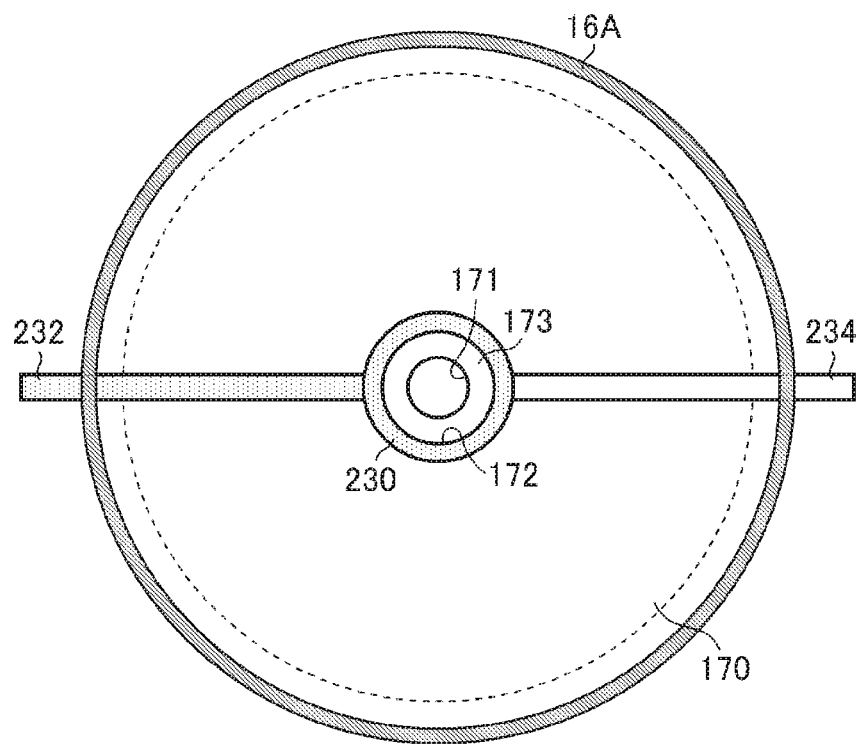
FIG. 14 is an Arrow D diagram when viewed in the direction of Arrow D in FIG. 13.

FIGS. 13 and 14 illustrate a fourth embodiment. FIG. 14 is an Arrow D diagram when viewed in the direction of Arrow D in FIG. 13. In FIGS. 13 and 14, any component identical or similar to that in the configurations illustrated in FIGS. 9 and 10 and FIGS. 3 and 4 is denoted by an identical reference sign, and description thereof will be omitted. The following describes difference from the configuration of the first embodiment illustrated in FIGS. 3 and 4.

The EUV light generation apparatus 12 according to the fourth embodiment includes a cooling water flow path 230 in the second pipe 172 of the gas introducing member 170. The cooling water flow path 230 disposed to surround the sidewall of the second pipe 172. The cooling water flow path 230 is connected with a cooling water introduction pipe line 232 and a cooling water discharge pipe line 234.

11.2 Operation

Cooling water is supplied from a cooling water supply source (not illustrated) to the cooling water flow path 230 through the cooling water introduction pipe line 232. The cooling water flows inside the cooling water flow path 230 to the cooling water discharge pipe line 234, and is discharged out of the wall of the chamber 16.

The temperature of the cooling water supplied to the cooling water flow path 230 may be, for example, 5° C. to 25° C. The flow rate of the cooling water may be, for example, one liter per minute.

The cooling water corresponds to exemplary cooling fluid. The cooling water flow path 230 corresponds to an exemplary cooling flow path.

11.3 Effects

The temperatures of the first pipe 171 and the second pipe 172 forming the opening 170A of the gas introducing member 170 are increased by heat from a plasma region. In particular, the temperature of the second pipe 172 on the outer side, which is closer to the plasma region, increases than that of the first pipe 171. When the target substance is tin, the gas temperature increases upon contact of stannane gas ($SnH_4$) generated in the plasma generation region 26 with the first pipe 171 having the increased temperature, and the speed of decomposition given by an expression below increases.

$$SnH_4(g) \rightarrow Sn(s) + H_2(g)$$

When the stannane gas having the increased temperature is decomposed on the surface of the EUV light focusing mirror, Sn accumulates on the mirror surface. As a result, the reflectance of the EUV light focusing mirror decreases, and the energy of EUV light decreases.

To solve such a problem, according to the fourth embodiment, in addition to the effects of the third embodiment, the second pipe 172 is cooled, and thus the gas temperature is unlikely to increase when the stannane gas contacts the second pipe 172. Accordingly, the Sn accumulation on the surface of the EUV light focusing mirror can be reduced.

12. Debris Reduction Effect of Gas Flow

A ratio R of reduction of debris by gas flow is "reduced contaminated object mass when gas flows"/"contaminated object mass when no gas flows", and given by an expression below.

[Expression 3]

$$R = EXP(Pe) \qquad (3)$$

In Expression (3), Pe represents the Peclet number, and EXP(x) represents an exponential function.

Expression (3) indicates that debris can be prevented from reaching the nozzle by increasing the Peclet number. The Peclet number is given by an expression below.

[Expression 4]

$$Pe = vL/D_f \qquad (4)$$

Pe: Peclet number
v: representative speed; gas flow speed (m/s)
Df: molecule diffusion coefficient; diffusion coefficient (m²/s) of debris in gas
L: representative length; single pipe part length (m)

The Peclet number in a case of a circular pipe is given by an expression below.

[Expression 5]

$$Pe = \left(\frac{Q}{PS}\right)L/D_f = \left(\frac{Q}{P}\frac{4}{\pi D^2}\right)L/D_f \qquad (5)$$

Q: flow rate (Pa·m³/s) of gas flowing inside the single circular pipe
P: pressure (Pa) in the chamber
S: flow path cross-sectional area (m²) of the single circular pipe part
D: inner diameter (m) of the single circular pipe
P·$D_f$ is eight in calculation of Expressions (1) and (2) above.

13. Reynolds Number

The Reynolds number is given by an expression below.
[Expression 6]

$$Re = \frac{\rho v L}{\mu} \qquad (6)$$

ρ: fluid density (kg/m³); hydrogen density is 2.94×10⁻⁵ (kg/m³)
v: fluid average speed (m/s)
L: characteristic length (m); in a case of a double circular pipe, twice as large as the gap
μ: fluid viscosity coefficient (Pa·s); hydrogen viscosity coefficient is 8.7×10⁻⁶ (Pa·s)

The Reynolds number in a case of a circular pipe is given by an expression below.

[Expression 7]

$$Re = \rho\left(\frac{Q}{PS}\right)L/\mu = \rho\left(\frac{Q}{P}\frac{4}{\pi(D_2^2 - D_1^2)}\right)L/\mu \qquad (7)$$

Q: flow rate (Pa·m³/s) of gas flowing in the double circular pipe
P: pressure (Pa) in the chamber S: flow path cross-sectional area (m²) of the double circular pipe part
$D_1$: inner diameter (m) of the flow path of the double circular pipe part
$D_2$: outer diameter (m) of the flow path of the double circular pipe part

14. Laser Apparatus

The laser apparatus 14 may include a pre-pulse laser apparatus configured to output a pre-pulse laser beam, and a main pulse laser apparatus configured to output a main pulse laser beam. In the LPP EUV light generation apparatus 12 according to the present embodiment, a target in the droplet form is diffused through irradiation with the pre-pulse laser beam to form a diffused target, and then the diffused target is irradiated with the main pulse laser beam. In this manner, plasma can be efficiently generated from the target substance through irradiation of the diffused target with the main pulse laser beam. This leads to improvement of the conversion efficiency (CE) of from the energy of a pulse laser beam to the energy of EUV light.

In the pre-pulse laser beam for forming a diffused target, the pulse width of each pulse is shorter than one nanosecond [ns], preferably shorter than 500 picoseconds [ps], further preferably shorter than 50 picoseconds [ps]. In addition, in the pre-pulse laser beam, the fluence of each pulse is equal to or smaller than the fluence of the pulse of the main pulse laser beam, and is equal to or larger than 6.5 J/cm², preferably equal to or larger than 30 J/cm², further preferably equal to or larger than 45 J/cm².

With such a configuration, the target can be broken down into minute particles and diffused by shortening the pulse width of each pulse of the pre-pulse laser beam. Accordingly, when irradiated with the main pulse laser beam, the diffused target is efficiently turned into plasma, thereby improving the CE.

The target may be irradiated with a plurality of pre-pulse laser beams before the irradiation with the main pulse laser beam.

15. Combination of Embodiments and Modifications

Components of the configurations described above in the embodiments and modifications may be combined as appropriate.

The above description is intended to provide not restriction but examples. Thus, the skilled person in the art would clearly understand that the embodiments of the present disclosure may be changed without departing from the scope of the claims.

The terms used throughout the specification and the appended claims should be interpreted as "non-limiting". For example, the term "comprising" or "comprised" should be interpreted as "not limited to what has been described as being comprised". The term "having" should be interpreted as "not limited to what has been described as having".

Further, the modifier "a/an" described in the specification and the appended claims should be interpreted to mean "at least one" or "one or more".

What is claimed is:

1. An extreme ultraviolet light generation apparatus comprising:
    a chamber in which plasma is generated;
    a target supply unit configured to supply a droplet of a target substance to a plasma generation region in the chamber;
    a first pipe covering at least part of a trajectory of the droplet and having a first end part as an upstream end part and a second end part as a downstream end part in a trajectory direction of the droplet, both end parts being opened;
    a second pipe covering at least part of the first pipe with a gap between the second pipe and the at least part of the first pipe, one of both end parts of the second pipe being a third end part as a downstream end part in the trajectory direction of the droplet, the third end part being opened and extending downstream of the second end part of the first pipe in the trajectory direction; and
    a gas supply unit configured to supply gas flowing through the gap between the first pipe and the second pipe and cause the gas to flow in the trajectory direction out of a gas exit opened on the second end part side of the gap.

2. The extreme ultraviolet light generation apparatus according to claim 1, further comprising:
    a first shield member extending at an outside part of the first pipe; and
    a second shield member extending at an outside part of the second pipe, wherein
    a gas introducing space is provided between the first shield member and the second shield member,
    the gas introducing space communicates with the gap between the first pipe and the second pipe, and
    gas introduced from the gas supply unit to the gas introducing space is supplied from the gas introducing space to the gap.

3. The extreme ultraviolet light generation apparatus according to claim 1, further comprising:
    a double pipe part at which at least part of the first pipe is covered by the second pipe; and
    a single pipe part of the second pipe extending downstream of the second end part of the first pipe in the trajectory direction,
    wherein gas flows under a condition that the double pipe part has a Reynolds number equal to or smaller than a critical Reynolds number and the single pipe part has a Peclet number equal to or larger than five.

4. The extreme ultraviolet light generation apparatus according to claim 1, wherein the first pipe and the second pipe are each a circular pipe or a rectangular pipe.

5. The extreme ultraviolet light generation apparatus according to claim 1, further comprising a partition parallel to the trajectory direction of the droplet in the gap at a double pipe part at which at least part of the first pipe is covered by the second pipe.

6. The extreme ultraviolet light generation apparatus according to claim 5, wherein the partition is disposed at least at two places to divide a gas flow path in the gap at the double pipe part into at least two flow paths.

7. The extreme ultraviolet light generation apparatus according to claim 1, further comprising a tubular member disposed between the target supply unit and the first pipe and covering part of the trajectory of the droplet.

8. The extreme ultraviolet light generation apparatus according to claim 7, wherein
    one of both end parts of the tubular member is a fourth end part as a downstream end part in the trajectory direction and is opened, and
    the fourth end part is not in contact with the first pipe.

9. The extreme ultraviolet light generation apparatus according to claim 8, wherein
    the tubular member includes an attachment part for fixing the tubular member on a side closer to a fifth end part opposite to the fourth end part, and
    the attachment part is provided at a position farther from the first pipe than a nozzle hole of the target supply unit through which the target substance is output.

10. The extreme ultraviolet light generation apparatus according to claim 7, wherein the tubular member is provided with an opening through which gas flowing upstream in the trajectory direction inside the tubular member flows out of the tubular member.

11. The extreme ultraviolet light generation apparatus according to claim 10, wherein the opening is provided at a position farther from the first pipe than the nozzle hole of the target supply unit through which the target substance is output.

12. The extreme ultraviolet light generation apparatus according to claim 1, wherein flow path cross-sectional area in at least one of the first pipe and the second pipe is larger at a position further downstream in the trajectory direction.

13. The extreme ultraviolet light generation apparatus according to claim 1, wherein
    an angle at which a sidewall of each of the first pipe and the second pipe intersects with a reference line orthogonal to the trajectory direction is 90° to 110°, and
    the angle is an intersection angle defined by the reference line extending outside the second pipe and the sidewall upstream of the reference line in the trajectory direction.

14. The extreme ultraviolet light generation apparatus according to claim 7, wherein flow path cross-sectional area in the tubular member is larger at a position further upstream in the trajectory direction.

15. The extreme ultraviolet light generation apparatus according to claim 14, wherein
    an angle at which a sidewall of the tubular member intersects with a reference line orthogonal to the trajectory direction is 80° to 90°, and
    the angle is an intersection angle defined by the reference line extending outside the tubular member and the sidewall upstream than the reference line in the trajectory direction.

16. The extreme ultraviolet light generation apparatus according to claim 2, wherein
    the first end part of the first pipe extends upstream of the first shield member in the trajectory direction, and
    part of gas flowing out of the gas exit flows upstream in the trajectory direction inside the first pipe.

17. The extreme ultraviolet light generation apparatus according to claim 1, wherein
    the chamber includes
        a first container,
        a second container communicating with the first container, and
        a stage supporting the second container movable relative to the first container,
    the first container and the second container are coupled with each other through the stage,
    the target supply unit is fixed to the second container, and a gas introducing member including the first pipe and the second pipe is fixed to the first container.

18. The extreme ultraviolet light generation apparatus according to claim 1, wherein the second pipe is provided with a cooling flow path through which cooling fluid for cooling the second pipe flows.

\* \* \* \* \*